United States Patent
Burton et al.

(10) Patent No.: US 10,411,086 B2
(45) Date of Patent: Sep. 10, 2019

(54) HIGH VOLTAGE CAPACITOR AND METHOD

(71) Applicant: Semiconductor Components Industries, LLC, Phoenix, AZ (US)

(72) Inventors: Richard Scott Burton, Phoenix, AZ (US); Karel Ptacek, Roznov Pod Radhostem (CZ)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 113 days.

(21) Appl. No.: 14/663,587

(22) Filed: Mar. 20, 2015

(65) Prior Publication Data

US 2015/0287774 A1 Oct. 8, 2015

Related U.S. Application Data

(60) Provisional application No. 61/976,429, filed on Apr. 7, 2014.

(51) Int. Cl.
*H01L 49/02* (2006.01)
*H01L 27/08* (2006.01)

(52) U.S. Cl.
CPC .......... *H01L 28/60* (2013.01); *H01L 27/0805* (2013.01)

(58) Field of Classification Search
CPC .......................... H01L 27/0805; H01L 28/60
USPC ........................................................ 257/532
See application file for complete search history.

(56) References Cited

U.S. PATENT DOCUMENTS

| | | | | |
|---|---|---|---|---|
| 4,100,561 A * | 7/1978 | Ollendorf | ........... | H01L 27/0251 257/357 |
| 4,757,363 A * | 7/1988 | Bohm | ................ | H01L 27/0251 257/358 |
| 4,837,606 A * | 6/1989 | Goodman | ........... | H01L 29/1095 257/139 |
| 4,947,230 A * | 8/1990 | Kapoor | ............... | H01L 21/8222 257/477 |
| 5,077,591 A * | 12/1991 | Chen | .................. | H01L 27/0259 257/109 |
| 5,087,954 A * | 2/1992 | Shirai | ................... | H01L 27/092 257/369 |
| 5,138,417 A * | 8/1992 | Noda | ................. | H01L 29/0804 257/542 |
| 5,150,187 A * | 9/1992 | Huang | ............... | H01L 27/0251 257/359 |
| 5,187,637 A | 2/1993 | Embree | | |

(Continued)

*Primary Examiner* — Ori Nadav
(74) *Attorney, Agent, or Firm* — Rennie William Dover

(57) ABSTRACT

In accordance with an embodiment, a method of manufacturing an electrical component that may include a high voltage capacitor that includes providing a semiconductor material of a second conductivity type in which first doped region of a first conductivity type is formed. A plurality of doped regions of the first conductivity type and a plurality of doped regions of the second conductivity type are formed in the first doped region. A first p-n junction is formed between first doped regions of the first and second conductivity types and a second p-n junction is formed between second doped regions of the first and second conductivity types. A metallization system is formed above the doped regions so that capacitors are formed by a parallel connection of a first metal layer to a polysilicon layer and the first metal layer to a second metal layer.

17 Claims, 21 Drawing Sheets

(56) References Cited

U.S. PATENT DOCUMENTS

| | | | | |
|---|---|---|---|---|
| 5,286,995 A * | 2/1994 | Malhi | H01L 29/7835 | 257/343 |
| 5,329,143 A * | 7/1994 | Chan | H01L 27/0251 | 257/173 |
| 5,545,908 A * | 8/1996 | Tokura | H01L 29/0878 | 257/341 |
| 5,594,265 A * | 1/1997 | Shimizu | H01L 27/0251 | 257/355 |
| 5,705,835 A * | 1/1998 | Nishiura | H01L 29/7455 | 257/107 |
| 5,770,886 A * | 6/1998 | Rao | H01L 27/0248 | 257/476 |
| 5,801,420 A * | 9/1998 | Fujishima | H01L 29/0634 | 257/133 |
| 6,043,532 A * | 3/2000 | Depetro | H01L 29/0696 | 257/335 |
| 6,066,863 A * | 5/2000 | Fujishima | H01L 29/0634 | 257/120 |
| 6,242,787 B1 * | 6/2001 | Nakayama | H01L 21/8249 | 257/335 |
| 6,462,378 B1 * | 10/2002 | Kim | H01L 29/0696 | 257/341 |
| 7,723,792 B1 * | 5/2010 | Pasqualini | H01L 27/0255 | 257/355 |
| 2001/0019140 A1 * | 9/2001 | Baek | H01L 21/76895 | 257/295 |
| 2001/0048139 A1 * | 12/2001 | Aigner | G01B 7/22 | 257/415 |
| 2008/0277761 A1 | 11/2008 | Mahalingam et al. | | |
| 2009/0280613 A1 * | 11/2009 | Onoda | H01L 21/26586 | 438/303 |
| 2010/0193851 A1 * | 8/2010 | Nagai | H01L 23/53238 | 257/295 |

* cited by examiner

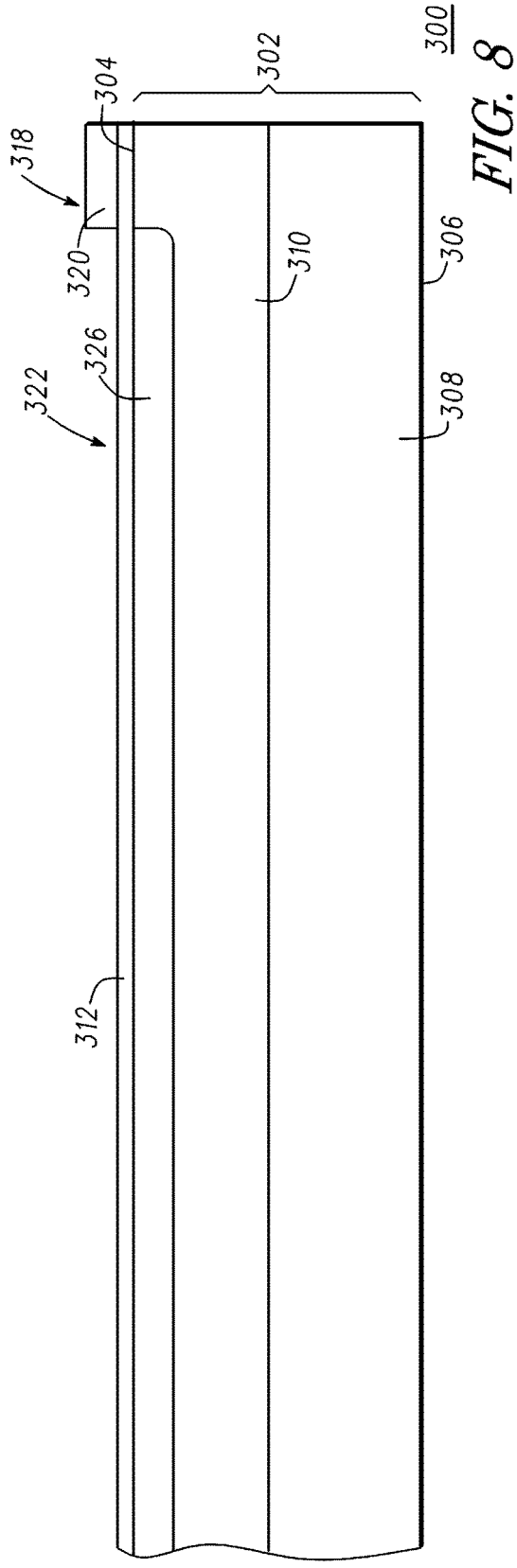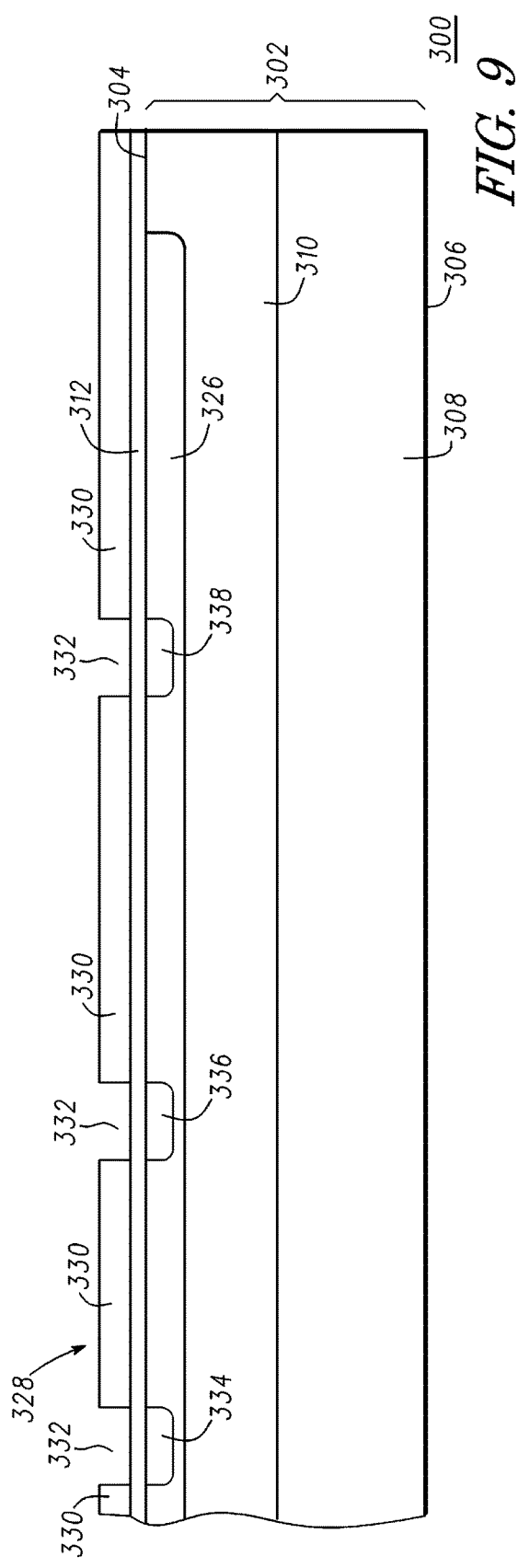

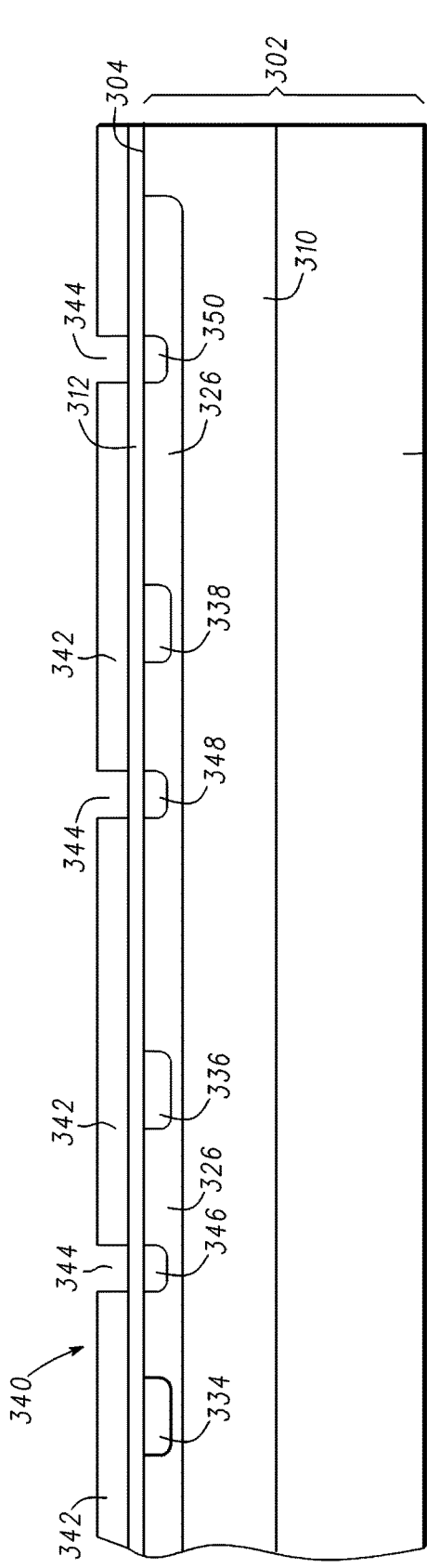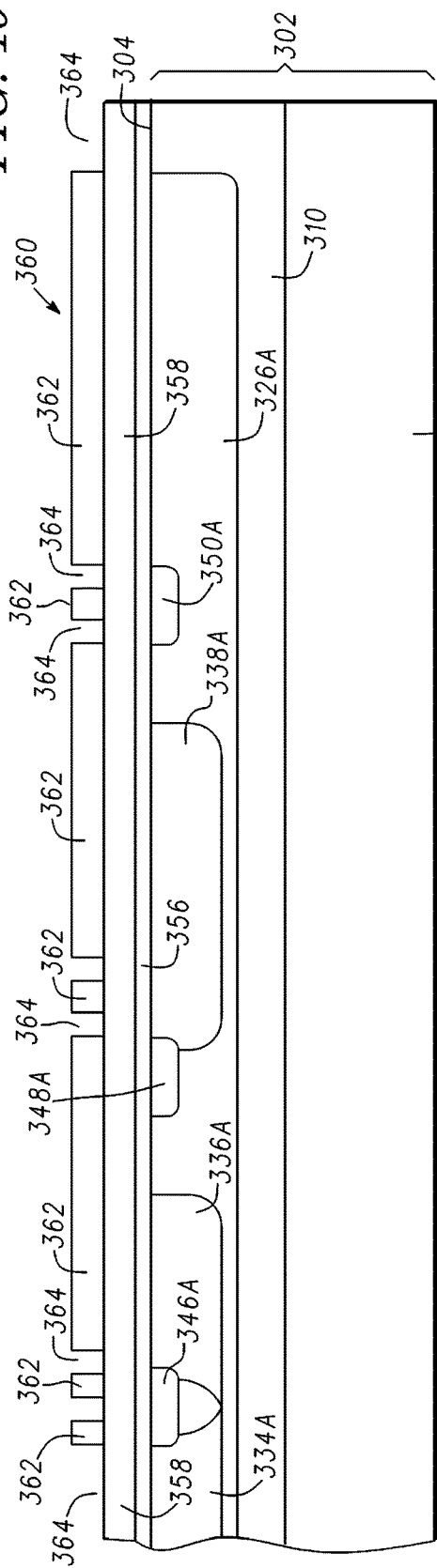

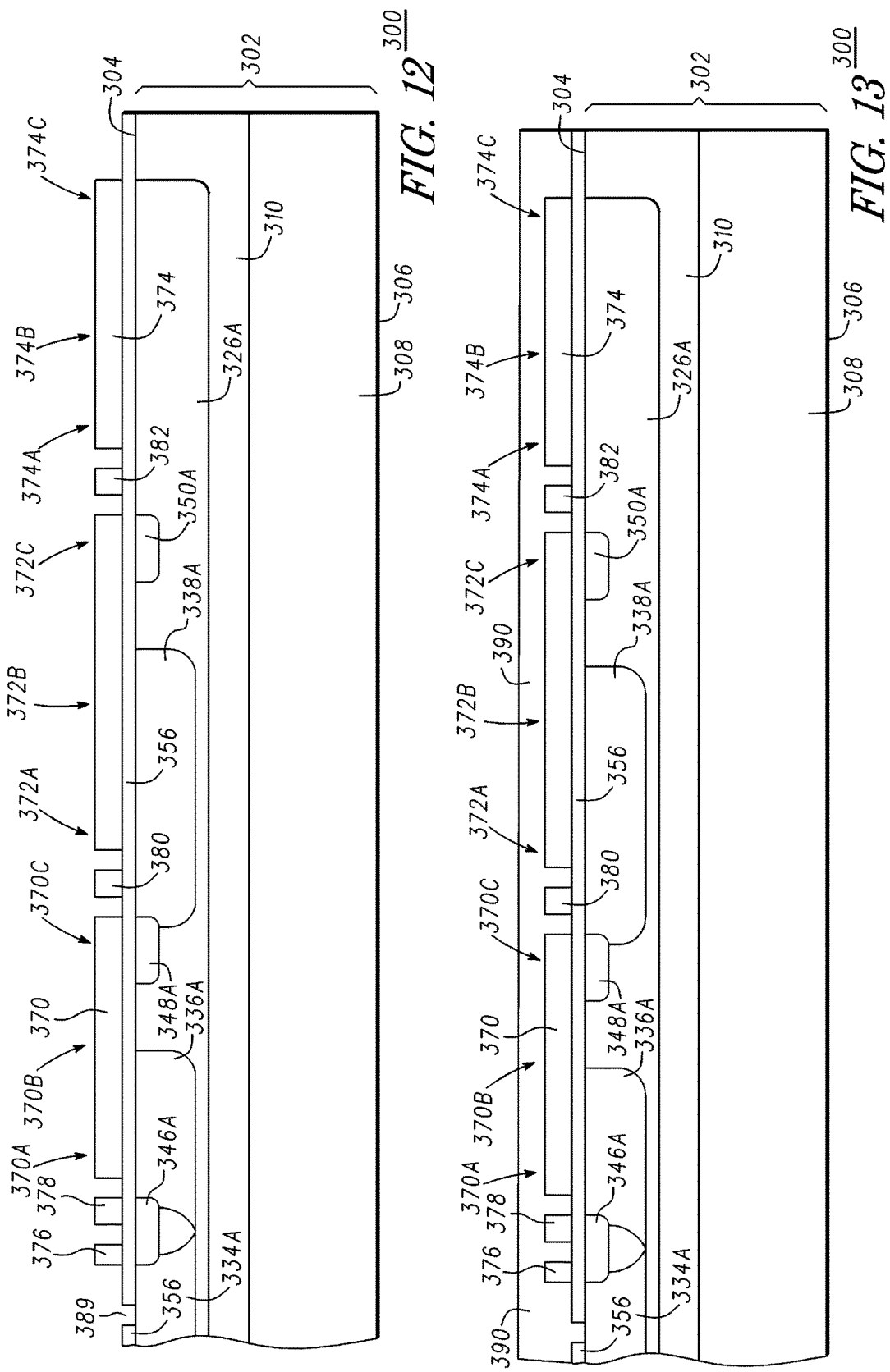

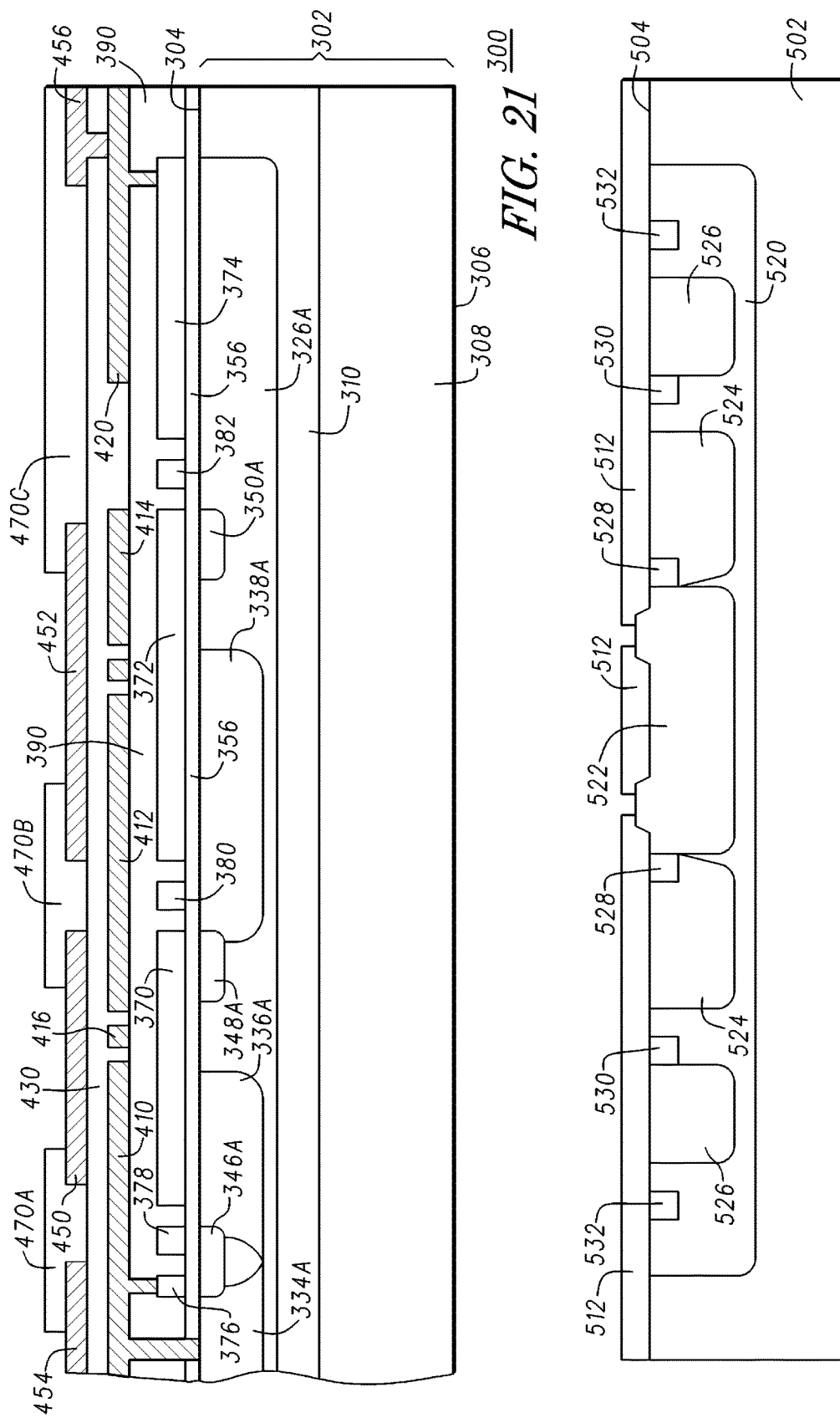

HIGH VOLTAGE CAPACITOR AND METHOD

BACKGROUND

The present invention relates, in general, to electronics and, more particularly, to methods of forming semiconductor devices and structure.

Circuit elements such as capacitors, resistors, and inductors are used in a variety of applications including telecommunications, automotive, computational, portable applications, power distribution systems, etc. Many of these types of systems include power converters that have a high voltage portion and a lower voltage portion and convert voltages from a high voltage level to a lower voltage level. In these types of applications, it may be desirable to monitor electrical parameters on the high voltage portion of the converter. High voltage capacitors or a network of capacitors have been used as dynamic sensing elements to monitor electrical signals on the high voltage portion of the converter. Capacitors may be configured to block direct current (DC) current voltage level while sensing dynamic voltage changes. In the past, these types of capacitor configurations have been expensive to implement and have been external to monolithically manufactured controller circuitry.

Accordingly, there is a need for a method and structure that permits monitoring of high power signals. It is desirable for the method and structure to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 8 is a cross-sectional view of a circuit element at an early stage of manufacture in accordance with another embodiment of the present invention;

FIG. 9 is a cross-sectional view of the circuit element of FIG. 8 at a later stage of manufacture;

FIG. 10 is a cross-sectional view of the circuit element of FIG. 9 at a later stage of manufacture;

FIG. 11 is a cross-sectional view of the circuit element of FIG. 10 at a later stage of manufacture;

FIG. 12 is a cross-sectional view of the circuit element of FIG. 11 at a later stage of manufacture;

FIG. 13 is a cross-sectional view of the circuit element of FIG. 12 at a later stage of manufacture;

FIG. 21 is a cross-sectional view of the circuit element of FIG. 20 at a later stage of manufacture;

FIG. 22 is a cross-sectional view of a circuit element at an early stage of manufacture in accordance with another embodiment of the present invention;

Figure 1:
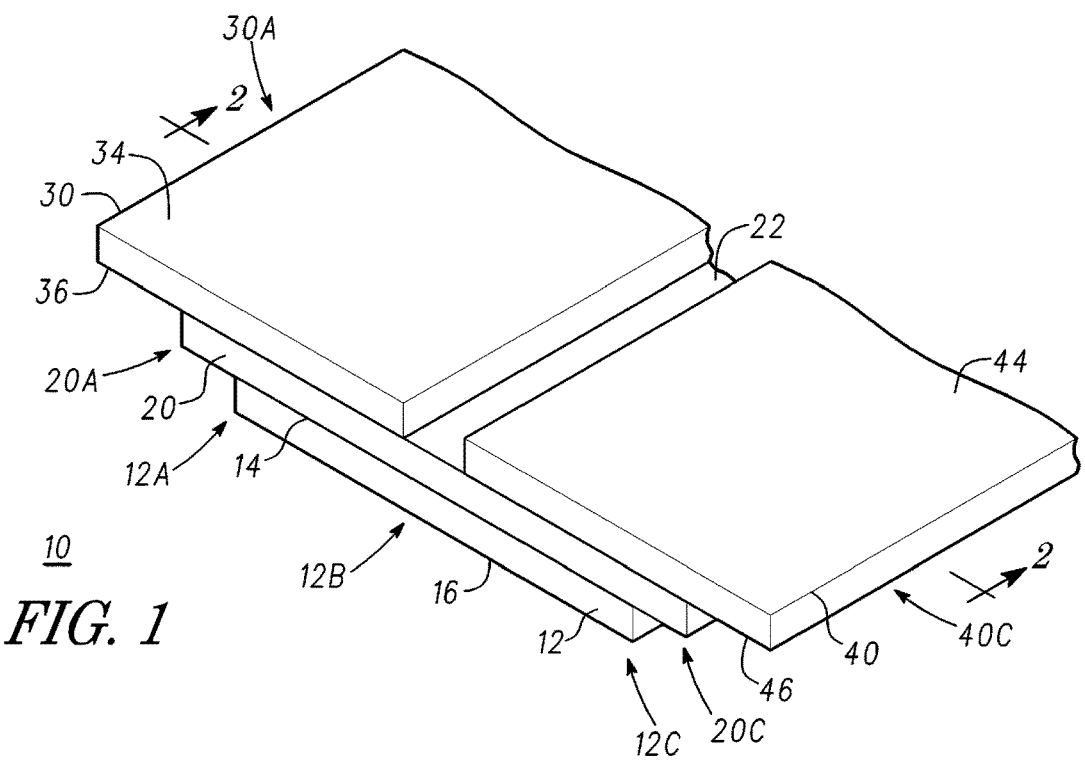
FIG. 1 is an isometric view of a circuit element in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It should be noted that a doped region may be referred to as a dopant region. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of being exactly as described.

DETAILED DESCRIPTION

Generally, embodiments of the present invention include an electrical component and a method for manufacturing the electrical component that comprises a high voltage capacitor structure capable of handling hundreds of volts. The high voltage capacitor may be manufactured as a discrete device, or manufactured from a semiconductor material, manufactured as a monolithically integrated circuit, or the like. In some embodiments a semiconductor device including a high voltage capacitor can be formed on a semiconductor substrate and include a first conductor layer on the semiconductor substrate, a second conductor layer disposed over the first conductor layer, and a third conductor layer disposed over the second conductor layer. The first, second, and third conductor layers are separated by dielectric material. The first, second, and third conductor layers include laterally separated portions, including a first portion of the third conductor layer being vertically aligned with, and DC-connected to a corresponding first portion of the first conductor layer, and a second portion of the third conductor layer being vertically aligned with and DC-connected to a corresponding second portion of the first conductor layer. A first portion of the second conductor layer forms a high voltage input and extends partially between the first portions of the first and third conductor layers. A second portion of the second conductor layer extends from partially between the first portions of the first and third conductor layers to partially between the second portions of the first and third conductor layers. A third portion of the second conductor layer extends from partially between the second portions of the first and third conductor layers outwards beyond the edges of the second portions of the first and third conductor layers.

In other embodiments, an electrical component, comprises a first electrical conductor having a first major surface and a second major surface; a first dielectric material having a first major surface and a second major surface, wherein a first portion of the first major surface of the first dielectric material is adjacent the second major surface of the first electrical conductor; a second electrical conductor having a first major surface and a second major surface, the first major surface of the second electrical conductor adjacent a first portion of the second major surface of the first dielectric material; and a third electrical conductor having a first major surface and a second major surface, the first major surface of the third electrical conductor adjacent a second portion of the second major surface of the first dielectric material.

In accordance with an embodiment, a method of manufacturing an electrical component is provided that comprises providing a semiconductor material having a major surface; forming a first layer of dielectric material over the major surface; forming a first electrically conductive structure over a first portion of the first layer of dielectric material and forming a second electrically conductive structure over a second portion of the first layer of dielectric material, the first electrically conductive structure having a first end and a second end and the second electrically conductive structure having a first end and a second end, the first electrically conductive structure spaced apart from the second electrically conductive structure; forming a second layer of dielectric material over the first electrically conductive structure; and forming a third electrically conductive structure over the second layer of dielectric material, the third electrically conductive structure having a first end and a second end, first end of the third electrically conductive structure over a portion of the first electrically conductive structure and the second end of the third electrically conductive structure over a portion of the second electrically conductive structure.

Figure 2:
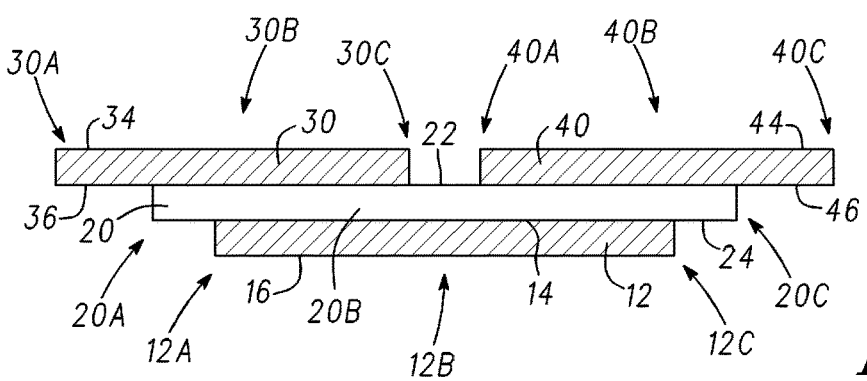
FIG. 2 is a cross-sectional view of the circuit element shown FIG. 1.

FIG. 1 is an isometric view of a circuit element 10 in accordance with an embodiment of the present invention and FIG. 2 is a cross-sectional view of circuit element 10 taken along section line 2-2 of FIG. 1. For the sake of convenience, FIGS. 1 and 2 are described together. By way of example, circuit element 10 is a high voltage capacitor. What is shown in FIG. 1 is an electrical conductor 12 having an end 12A, a central portion 12B, an end 12C, a major surface 14, and a major surface 16. Major surfaces 14 and 16 may be referred to as being opposing surfaces or as being on opposite sides of electrical conductor 12. Electrical conductor 12 may be a metal, a doped semiconductor material, or other electrically conductive material. Examples of suitable conductors include copper, aluminum, tungsten, doped amorphous semiconductor material, polycrystalline semiconductor material, composite conductive materials, or the like. A dielectric material 20 is formed on surface 14 of electrical conductor 12. Dielectric material 20 has an end 20A, a central portion 20B, an end 20C, a major surface 22, and a major surface 24. Similar to electrical conductor 12, surfaces 22 and 24 may be referred to as being opposing surfaces or as being on opposite sides of dielectric material 20. Suitable materials for dielectric material 20 include silicon dioxide, tetraethylorthosilicon (TEOS), silicon on glass (SOG), silicon nitride, silicon rich nitride, polymeric materials, a substantially non-conductive high-bandgap semiconductor material, composite dielectric materials, or the like. Dielectric layer 20 may be formed by deposition techniques including Chemical Vapor Deposition (CVD), Plasma Enhanced Chemical Vapor Deposition (PECVD); growth techniques; oxidation techniques; spin-on techniques; sputtering; anodization; lamination; or the like.

An electrical conductor 30 is formed in contact with a portion of dielectric material 20 and an electrical conductor 40 is formed in contact with another portion of dielectric material 20. Electrical conductor 30 has an end 30A, a central portion 30B, an end 30C, a major surface 34, and a major surface 36. Major surfaces 34 and 36 may be referred to as being opposing surfaces or as being on opposite sides of electrical conductor 30. Electrical conductor 40 has an end 40A, a central portion 40B, an end 40C, a major surface 44, and a major surface 46. Major surfaces 44 and 46 may be referred to as being opposing surfaces or as being on opposite sides of electrical conductor 40. Electrical conductors 30 and 40 may be a metal, a doped semiconductor material, a composite stack of electrically conductive materials, or other electrically conductive material. Examples of suitable metals include copper, aluminum, titanium, titanium-nitride, silver, gold, a refractory metal such as, for example, tungsten, or the like. End 30C of electrical conductor 30 is spaced apart and laterally adjacent to end 40A of electrical conductor 40. Thus, electrical conductors 30 and 40 are sufficiently spaced apart from each other, depending upon the specific dielectric material used, to inhibit excessive dielectric degradation which could lead to failure though Time Dependent Dielectric Breakdown (TDDB). In accordance with an embodiment, end 30A serves as a terminal of high voltage capacitor 10 and end 30C serves as another terminal of high voltage capacitor 10. Electrical conductors 30 and 40 may be formed by bonding metal layers to dielectric material 20, deposition techniques including evaporation, CVD, sputtering, electroless plating techniques, electroplating techniques, or the like.

Figure 3:
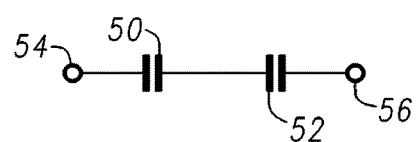
FIG. 3 is a circuit schematic of the circuit element shown in FIG. 1.

FIG. 3 is a circuit representation of high voltage capacitor 10 illustrated in FIGS. 1 and 2. More particularly, high voltage capacitor 10 is comprised of a capacitor 50 connected in series with a capacitor 52 and has terminals 54 and 56. Capacitor 50 is comprised of electrical conductor 30, a portion of electrical conductor 12, and a portion of dielectric material 20 that is between electrical conductor 30 and electrical conductor 12. Capacitor 52 is comprised of electrical conductor 40, another portion of electrical conductor 12, and a portion of dielectric material 20 that is between electrical conductor 40 and electrical conductor 12. End 30A serves as a terminal 54 and end 40C serves as terminal 56.

Figure 4:
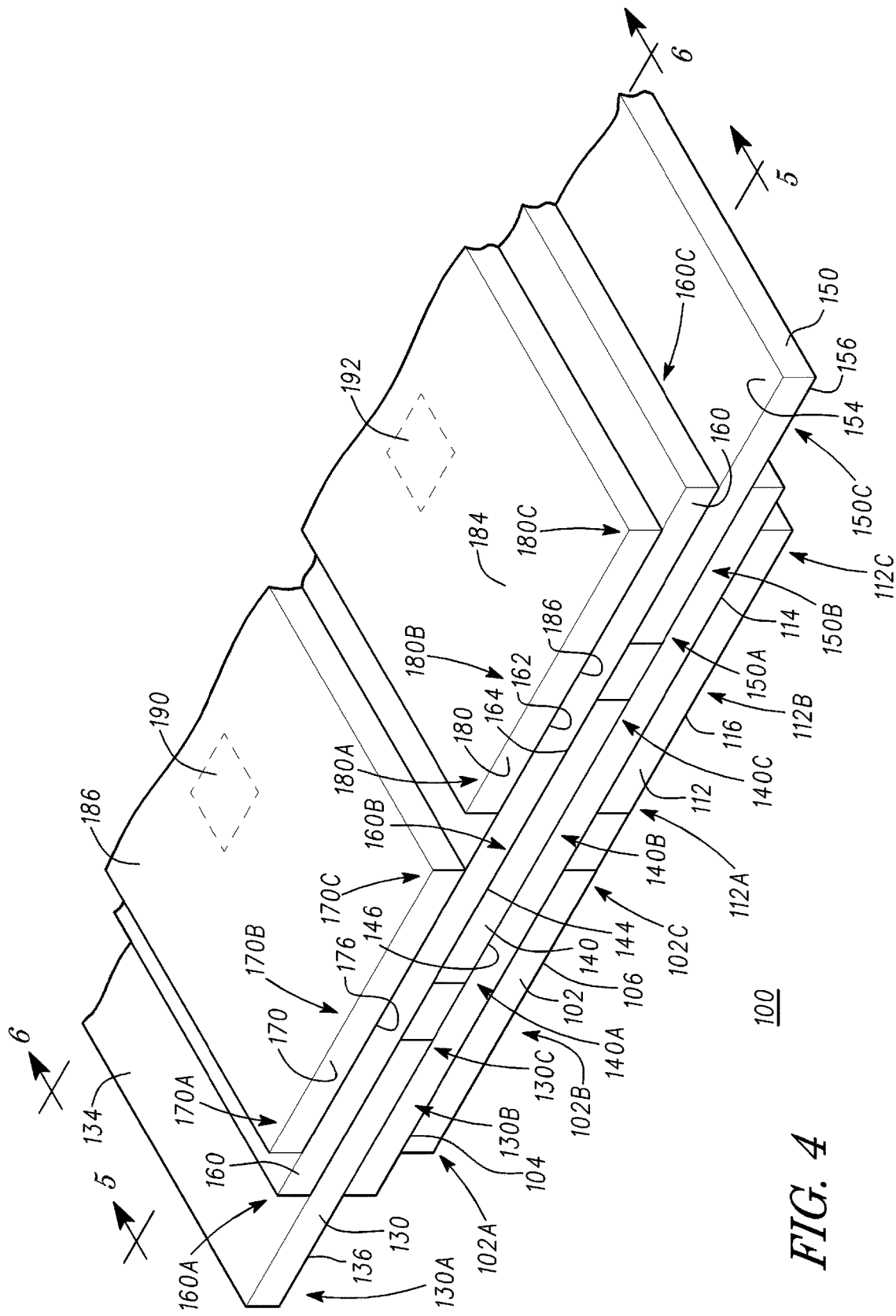
FIG. 4 is an isometric view of a circuit element in accordance with another embodiment of the present invention.
Figure 5:
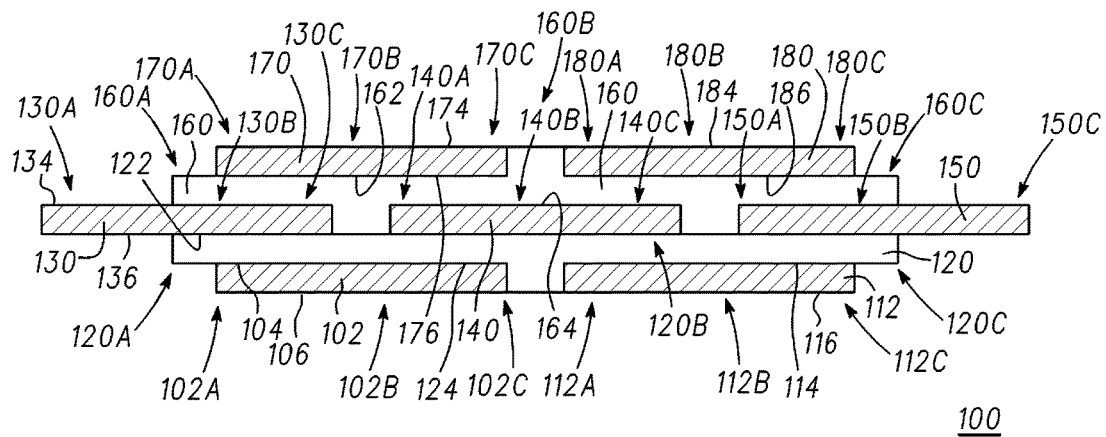
FIG. 5 is a cross-sectional view taken along section line 5-5 of the circuit element shown FIG. 4.
Figure 6:
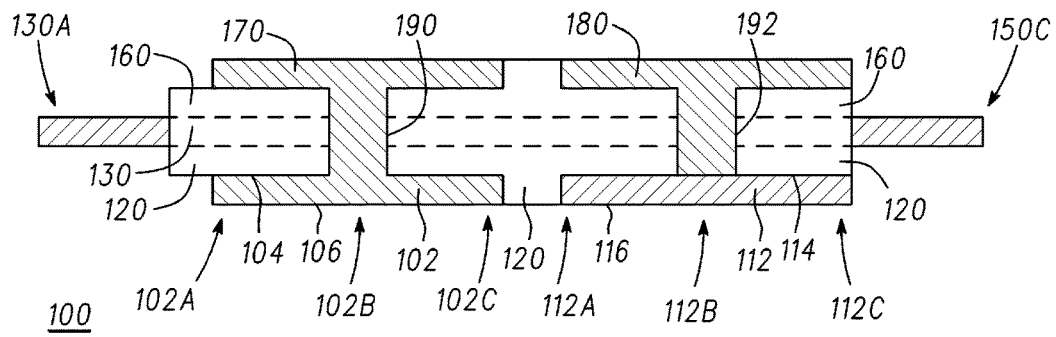
FIG. 6 is a cross-sectional view taken along section line 6-6 of the circuit element shown FIG. 4.

FIG. 4 is an isometric view of a circuit element 100 in accordance with an embodiment of the present invention and FIGS. 5 and 6 are cross-sectional views of circuit element 100 taken along section lines 5-5 and 6-6, respectively, of FIG. 4. For the sake of convenience, FIGS. 4, 5, and 6 are described together. By way of example, circuit element 100 is a high voltage capacitor. What is shown in FIG. 4 are electrical conductors 102 and 112, where electrical conductor 102 has an end 102A, a central portion 102B, an end 102C, a major surface 104, and a major surface 106. Major surfaces 104 and 106 may be referred to as being opposing surfaces or as being on opposite sides of electrical conductor 102. Electrical conductor 112 has an end 112A, a central portion 112B, an end 112C, a major surface 114, and a major surface 116. Major surfaces 114 and 116 may be referred to as being opposing surfaces or as being on opposite sides of electrical conductor 112. Electrical conductors 102 and 112 may be a metal, a doped semiconductor material, a composite stack of electrically conductive materials, or other electrically conductive material. Examples of suitable metals include copper, aluminum, titanium, titanium-nitride, silver, gold, a refractory metal such as, for example, tungsten, or the like. End 102C of electrical conductor 102 is spaced apart and laterally adjacent to end 112A of electrical conductor 112. Thus, electrical conductors 102 and 112 are spaced apart from each other.

A dielectric material 120 is formed on surface 104 of electrical conductor 102 and on surface 114 of electrical conductor 112. Dielectric material 120 has an end 120A, a central portion 120B, an end 120C, a major surface 122, and a major surface 124. Similar to electrical conductors 102 and 112, surfaces 122 and 124 may be referred to as being opposing surfaces or as being on opposite sides of dielectric material 120. A portion of dielectric material 120 is formed adjacent to ends 102C and 112A. Suitable material for dielectric material 120 include, oxide, silicon dioxide, silicon nitride, silicon rich nitride, polymeric materials, or the like. Dielectric layer 120 may be formed by deposition techniques including Chemical Vapor Deposition (CVD), Plasma Enhanced Chemical Vapor Deposition (PECVD); growth techniques; oxidation techniques; spin-on techniques; sputtering; anodization; lamination; or the like.

An electrical conductor 130 is formed in contact with a portion of dielectric material 120, an electrical conductor 140 is formed in contact with another portion of dielectric material 120, and another electrical conductor 150 is formed in contact with another portion of dielectric material 120. Electrical conductor 130 has an end 130A, a central portion 130B, an end 130C, a major surface 134, and a major surface 136. Major surfaces 134 and 136 may be referred to as being opposing surfaces or as being on opposite sides of electrical conductor 130. Electrical conductor 140 has an end 140A, a central portion 140B, an end 140C, a major surface 144, and a major surface 146. Major surfaces 144 and 146 may be referred to as being opposing surfaces or as being on opposite sides of electrical conductor 140. Electrical conductor 150 has an end 150A, a central portion 150B, an end 150C, a major surface 154, and a major surface 156. Major surfaces 154 and 156 may be referred to as being opposing surfaces or as being on opposite sides of electrical conductor 150.

Electrical conductors 130, 140, and 150 may be a metal, a doped semiconductor material, a composite stack of electrically conductive materials, or other electrically conductive material. Examples of suitable metals include copper, aluminum, titanium, titanium-nitride, silver, gold, a refractory metal such as, for example, tungsten, or the like. End 130C of electrical conductor 130 is spaced apart and laterally adjacent to end 140A of electrical conductor 140 and end 140C of electrical conductor 140 is spaced apart and laterally adjacent to end 150A of electrical conductor 150. Electrical conductors 130, 140, and 150 are sufficiently spaced apart from each other, depending upon the specific dielectric material used, to inhibit excessive dielectric degradation which could lead to failure though Time Dependent Dielectric Breakdown (TDDB). In accordance with an embodiment, end 130A serves as a terminal of high voltage capacitor 100 and end 150C serves as another terminal of high voltage capacitor 100. Electrical conductors 130, 140, and 150 may be a metal, a doped semiconductor material, a composite stack of electrically conductive materials, a plurality of layers of electrically conductive material, or other electrically conductive material. Examples of suitable metals include copper, aluminum, titanium, titanium-nitride, silver, gold, a refractory metal such as, for example, tungsten, or the like. Electrical conductors 130, 140, and 150 may be formed by bonding metal layers to dielectric material 20, deposition techniques including evaporation, CVD, sputtering, electroless plating techniques, electroplating techniques, or the like.

A dielectric material 160 is formed on surface 134 of electrical conductor 130, on surface 144 of electrical conductor 140, and on surface 154 of electrical conductor 150. Dielectric material 160 has an end 160A, a central portion 160B, an end 160C, a major surface 162, and a major surface 164. Similar to electrical conductors 130, 140, and 150, surfaces 162 and 164 may be referred to as being opposing surfaces or as being on opposite sides of dielectric material 160. A portion of dielectric material 160 is formed adjacent to ends 130C and 140A and a portion of dielectric material 160 is formed adjacent to ends 140C and 150A. Suitable material for dielectric material 160 include, oxide, silicon dioxide, silicon nitride, silicon rich nitride, polymeric materials, or the like. Dielectric layer 160 may be may be formed by deposition techniques including CVD and PECVD; growth techniques; oxidation techniques; spin-on techniques; sputtering; anodization; lamination; or the like.

An electrical conductor 170 is formed in contact with a portion of dielectric material 160 and an electrical conductor 180 is formed in contact with another portion of dielectric material 160. Electrical conductor 170 has an end 170A, a central portion 170B, an end 170C, a major surface 174, and a major surface 176. Major surfaces 174 and 176 may be referred to as being opposing surfaces or as being on opposite sides of electrical conductor 170. Electrical conductor 180 has an end 180A, a central portion 180B, an end 180C, a major surface 184, and a major surface 186. Major surfaces 184 and 186 may be referred to as being opposing surfaces or as being on opposite sides of electrical conductor 180.

Electrical conductors 170 and 180 may be a metal, a doped semiconductor material, a composite stack of electrically conductive materials, or other electrically conductive material. Examples of suitable metals include copper, aluminum, titanium, titanium-nitride, silver, gold, a refractory metal such as, for example, tungsten, or the like. End 170C of electrical conductor 170 is spaced apart and laterally adjacent to end 180A of electrical conductor 180. Thus, electrical conductors 170 and 180 are sufficiently spaced apart from each other, depending upon the specific dielectric material used, to inhibit excessive dielectric degradation which could lead to failure though Time Dependent Dielectric Breakdown (TDDB).

In accordance with an embodiment, end 130A serves as a terminal of high voltage capacitor 100 and end 150C serves as another terminal of high voltage capacitor 100. Electrical conductors 170 and 180 may be a metal, a doped semiconductor material, a composite stack of electrically conductive materials, a plurality of layers of electrically conductive material, or other electrically conductive material. Examples of suitable metals include copper, aluminum, titanium, titanium-nitride, silver, gold, a refractory metal such as, for example, tungsten, or the like. Electrical conductors 170 and 180 may be formed by bonding metal layers to dielectric material 160, deposition techniques including evaporation, CVD, sputtering, electroless plating techniques, electroplating techniques, or the like.

A filled via 190 electrically connects electrical conductor 170 with electrical conductor 102 and a filled via 192 electrically connects electrical conductor 180 with electrical conductor 112. Filled vias 190 and 192 are filled with an electrically conductive material. Suitable electrically conductive materials include copper, aluminum, a refractory metal, or the like. The region or locations at which filled vias 190 and 192 are formed are shown in FIG. 4 by rectangular structures formed from dashed lines.

Figure 7:
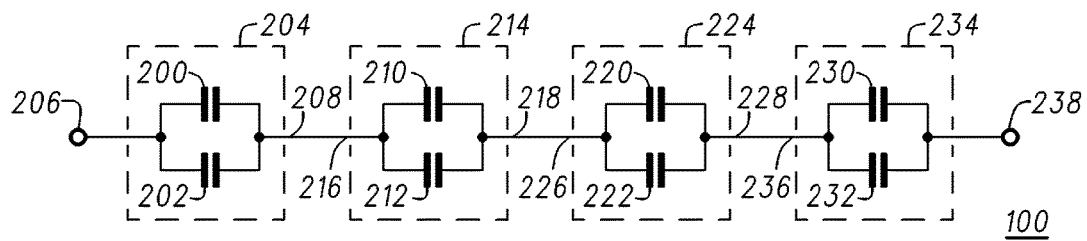
FIG. 7 is a circuit schematic of the circuit element shown in FIG. 4.

FIG. 7 is a circuit representation of high voltage capacitor 100 illustrated in FIGS. 4-6. More particularly, high voltage capacitor 100 is comprised of series connected parallel capacitor structures 204, 214, 224, and 234. More particularly, parallel capacitor structure 204 is comprised of a capacitor 200 connected in parallel with a capacitor 202 and having a terminal 206 and a terminal 208; parallel capacitor structure 214 is comprised of a capacitor 210 connected in parallel with a capacitor 212 and having a terminal 216 and a terminal 218; parallel capacitor structure 224 is comprised of a capacitor 220 connected in parallel with a capacitor 222 and having a terminal 226 and a terminal 228; and parallel capacitor structure 234 is comprised of a capacitor 230 connected in parallel with a capacitor 232 and having a terminal 236 and a terminal 238. Terminal 208 of parallel capacitor structure 204 is connected to terminal 216 of parallel capacitor structure 214, terminal 218 of parallel capacitor structure 214 is connected to terminal 226 of parallel capacitor structure 224, and terminal 228 of parallel capacitor structure 224 is connected to terminal 236 of parallel capacitor structure 234. Terminals 206 and 238 serve as external terminals for high voltage capacitor 100.

Briefly referring to FIGS. 4-7, capacitor 100 may be comprised of portions of electrical conductors 130 and 170 and the portion of dielectric material 160 between electrical conductors 130 and 170; capacitor 202 may be comprised of portions of electrical conductors 130 and 102 and the portion of dielectric material 120 between electrical conductors 130 and 102; capacitor 214 may be comprised of portions of electrical conductors 140 and 170 and the portion of dielectric material 160 between electrical conductors 140 and 170; capacitor 212 may be comprised of portions of electrical conductors 140 and 102 and the portion of dielectric material 120 between electrical conductors 140 and 102; capacitor 224 may be comprised of portions of electrical conductors 140 and 180 and the portion of dielectric material 160 between electrical conductors 140 and 180; capacitor 222 may be comprised of portions of electrical conductors 140 and 112 and the portion of dielectric material 120 between electrical conductors 140 and 112; capacitor 234 may be comprised of portions of electrical conductors 150 and 180 and the portion of dielectric material 160 between electrical conductors 150 and 180; and capacitor 232 may be comprised of portions of electrical conductors 150 and 112 and the portion of dielectric material 120 between electrical conductors 150 and 112. End 130A may serve as terminal 206 and end 150C may serve as terminal 238.

FIG. 8 is a cross-sectional view of a portion of a semiconductor component 300 such as, for example, a high voltage capacitor, during manufacture in accordance with an embodiment of the present invention. What is shown in FIG. 8 is a semiconductor material 302 having opposing surfaces 304 and 306. Surface 304 is also referred to as a front or top surface and surface 306 is also referred to as a bottom or back surface. In accordance with this embodiment for a device with a breakdown voltage of approximately 700 volts, semiconductor material 302 is comprised of a semiconductor substrate 308 doped with an impurity material of p-type conductivity and having a resistivity ranging from about 70 Ohm-centimeter ($\Omega$-cm) to about 100 $\Omega$-cm. Preferably, the resistivity of substrate 308 is 85 $\Omega$-cm. It should be appreciated that the resistivity of semiconductor material 302 is not a limitation. Suitable materials for substrate 308 include silicon and compound semiconductor materials such as, for example, gallium nitride, gallium arsenide, indium phosphide, Group III-V semiconductor materials, Group II-VI semiconductor materials, or the like.

In accordance with an embodiment, semiconductor material 302 further comprises an epitaxial layer 310 of p-type conductivity formed on high resistivity substrate 308. It should be noted that semiconductor material 302 may be comprised of a semiconductor substrate or a semiconductor substrate on which an epitaxial layer is formed. In addition, a buried layer (not shown) may be formed in a portion of substrate 308 and epitaxial layer 310.

It should be noted that a region or layer doped with an n-type dopant or impurity material is said to be of an n-type conductivity or an n conductivity type and a region or layer doped with a p-type dopant or impurity material is said to be of a p-type conductivity or a p conductivity type.

A layer of dielectric material 312 is formed on or from semiconductor material 302. In accordance with an embodiment, the material of dielectric layer 312 is silicon dioxide having a thickness ranging from about 100 Angstroms (Å) to about 1,000 Å. Techniques for forming silicon dioxide layer 312 are known to those skilled in the art. For example, dielectric layer 312 may be formed by oxidizing semiconductor material 302 or it may be a TEOS layer formed using plasma enhanced chemical vapor deposition. Dielectric layer 312 may be referred to as a screen implant layer. A layer of photoresist is patterned over dielectric layer 312 to form a masking structure 318 having a masking element 320 and an opening 322 that exposes a portion of dielectric layer 312.

Still referring to FIG. 8, an n-type doped region 326 is formed in the portion of epitaxial layer 310 unprotected by masking element 320 by implanting an impurity material of n-type conductivity through the exposed portions of dielectric layer 312 and into epitaxial layer 310. N-type dopant region 326 may be formed by implanting the impurity material into epitaxial layer 310 at a dose ranging from about $5\times10^{12}$ atoms per square centimeter (atoms/cm$^2$) to about $1\times10^{14}$ atoms/cm$^2$ and an implant energy ranging from about 25 kilo-electronVolts (keV) to about 50 keV.

Referring now to FIG. 9, masking structure 318 is removed and a layer of photoresist is patterned over dielectric layer 312 to form a masking structure 328 having a masking elements 330 and openings 332 that exposes portions of dielectric layer 312. N-type doped regions 334, 336, and 338 are formed in the portions of epitaxial layer 310 unprotected by masking elements 330 by implanting an impurity material of n-type conductivity through the exposed portions of dielectric layer 312 and into epitaxial layer 310. N-type doped regions 334, 336, and 338 may be formed by implanting the impurity material into epitaxial layer 310 at a dose ranging from about $5\times10^{12}$ atoms per square centimeter (atoms/cm$^2$) to about $1\times10^{14}$ atoms/cm$^2$ and an implant energy ranging from about 25 kilo-electronVolts (keV) to about 50 keV.

Referring now to FIG. 10, masking structure 328 is removed and a layer of photoresist is patterned over dielectric layer 312 to form a masking structure 340 having masking elements 342 and openings 344 that expose portions of dielectric layer 312. P-type doped regions 346, 348, and 350 are formed in the portions of epitaxial layer 310 unprotected by masking elements 342 by implanting an impurity material of p-type conductivity through the exposed portions of dielectric layer 312 and into epitaxial layer 310. Suitable p-type dopants or impurity materials include boron, indium, or the like. P-type doped regions 346, 348, and 350 may be formed by implanting the impurity material into epitaxial layer 310 at a dose ranging from about $5\times10^{12}$ atoms per square centimeter (atoms/cm$^2$) to about $1\times10^{14}$ atoms/cm$^2$ and an implant energy ranging from about 25 kilo-electronVolts (keV) to about 50 keV. It should be noted that p-type doped region 346 is laterally positioned between n-type doped regions 334 and 336, p-type doped region 348 is laterally positioned between n-type doped regions 336 and 338, and n-type doped region 336 is laterally positioned between p-type doped regions 346 and 348. P-type doped region 350 is on a side of n-type doped region 338 that is opposite to the side of n-type doped region on which p-type doped region 348 is formed.

Referring now to FIG. 11, masking elements 342 and dielectric layer 312 are removed and the n-type dopant or impurity materials and the p-type dopant or impurity materials are driven into epitaxial layer 310 by placing semiconductor material 302 in an inert ambient environment at a temperature ranging from about 1,000 degrees Celsius (° C.) to about 1,250° C. for a time ranging from about 2.5 hours to about 3.5 hours. By way of example, n-type doped regions 334A, 336A, and 338A and p-type doped regions 346A, 348A, and 350A are formed by driving the dopant into semiconductor material 302 for about 3 hours in a nitrogen ambient environment at a temperature of about 1,150° C. It should be noted that reference character A has been appended to reference characters 334, 336, and 338 to distinguish the doped regions before and after the drive-in step. Similarly, the reference character A has been appended to reference characters 346, 348, and 350 to distinguish the doped regions before and after the drive-in step. Although doped regions 326A, 334A, 336A, 338A, 346A, 348A, and 350A are shown as being within epitaxial layer 310, this is not a limitation. Thus, one or more of doped regions 326A, 334A, 336A, 338A, 346A, 348A, and 350A may extend through epitaxial layer 310 and into semiconductor substrate 308. Doped region 326A may be referred to as an n-well 326A, doped region 334A may be referred to as an n-well 334A, doped region 336A may be referred to as an n-well 338A, doped region 346A may be referred to as PTOP region 346A, doped region 348A may be referred to as a PTOP region 348A, and doped region 350A may be referred to as a PTOP region 350A because they are p-type regions at the top of the semiconductor material.

Still referring to FIG. 11, a layer of dielectric material 356 is formed on or from semiconductor material 302. In accordance with an embodiment, the material of dielectric layer 356 is silicon dioxide having a thickness ranging from about 100 Å to about 1,000 Å. Techniques for forming silicon dioxide layer 356 are known to those skilled in the art. For example, dielectric layer 356 may be formed by oxidizing semiconductor material 302 or it may be a TEOS layer formed using plasma enhanced chemical vapor deposition. A layer 358 of electrically conductive material is formed on dielectric layer 356. Suitable materials for electrically conductive layer 358 include polysilicon doped with an impurity material, copper, aluminum, a refractory metal, or the like. In accordance with an embodiment, electrically conductive layer 358 is polysilicon doped with an n-type impurity material. A layer of photoresist is patterned over electrically conductive layer 358 to form a masking structure 360 having masking elements 362 and openings 364 that expose portions of electrically conductive layer 358.

Referring now to FIG. 12, the portions of electrically conductive layer 358 unprotected by masking elements 362 are removed using, for example, a reactive ion etching technique to separate electrically conductive layer 358 into a plurality of portions that serve as electrically conductive structures. More particularly, electrically conductive layer 358 is separated into electrically conductive structures 370, 372, 374, 376, 378, 380, and 382. Electrically conductive structure 370 has an end 370A spaced apart from an end 370C by a central portion 370B. In accordance with an embodiment, electrically conductive structure 370 is above p-type doped region 348A and above a side of n-well 336A, end 370A is laterally spaced apart from p-type doped region 346A and positioned to be above n-well 336A, and end 370C is positioned to be above p-type doped region 348A.

Electrically conductive structure 372 has an end 372A spaced apart from an end 372C by a central portion 372B. In accordance with an embodiment, electrically conductive structure 372 is above p-type doped region 350A and above a side of n-well 338A, end 372A is laterally spaced apart from p-type doped region 348A and positioned to be above n-well 338A, and end 372C is positioned to be above p-type doped region 350A.

Electrically conductive structure 374 has an end 374A spaced apart from an end 374C by a central portion 374B. In accordance with an embodiment, electrically conductive structure 374 is above n-well 326A and configured to be between p-type doped region 350A and a side of n-well 326A.

Electrically conductive structures 376 and 378 are positioned to be above p-type doped region 364A and adjacent to end 370A of electrically conductive structure 370. Electrically conductive structure 378 is positioned to be laterally between electrically conductive structures 376 and 370.

Electrically conductive structure 380 is positioned to be between end 370C of electrically conductive structure 370 and end 372A of electrically conductive structure 372.

Electrically conductive structure 382 is positioned to be between end 372C of electrically conductive structure 372 and end 374A of electrically conductive structure 374. Masking structure 360 is removed and layer of photoresist is patterned over electrically conductive layer to form a masking structure having masking elements and an opening that exposes a portion of dielectric layer 356 over n-well 334A. The exposed portion of dielectric layer 356 is removed using, for example, a reactive ion etch to form an opening 389 that exposes a portion of surface 304 over n-well 334A.

Referring now to FIG. 13, a layer of dielectric material 390 is formed over electrically conductive structures 370, 372, 374, 376, 378, 380, and 382 and over the exposed portions of dielectric layer 356.

Figure 14:
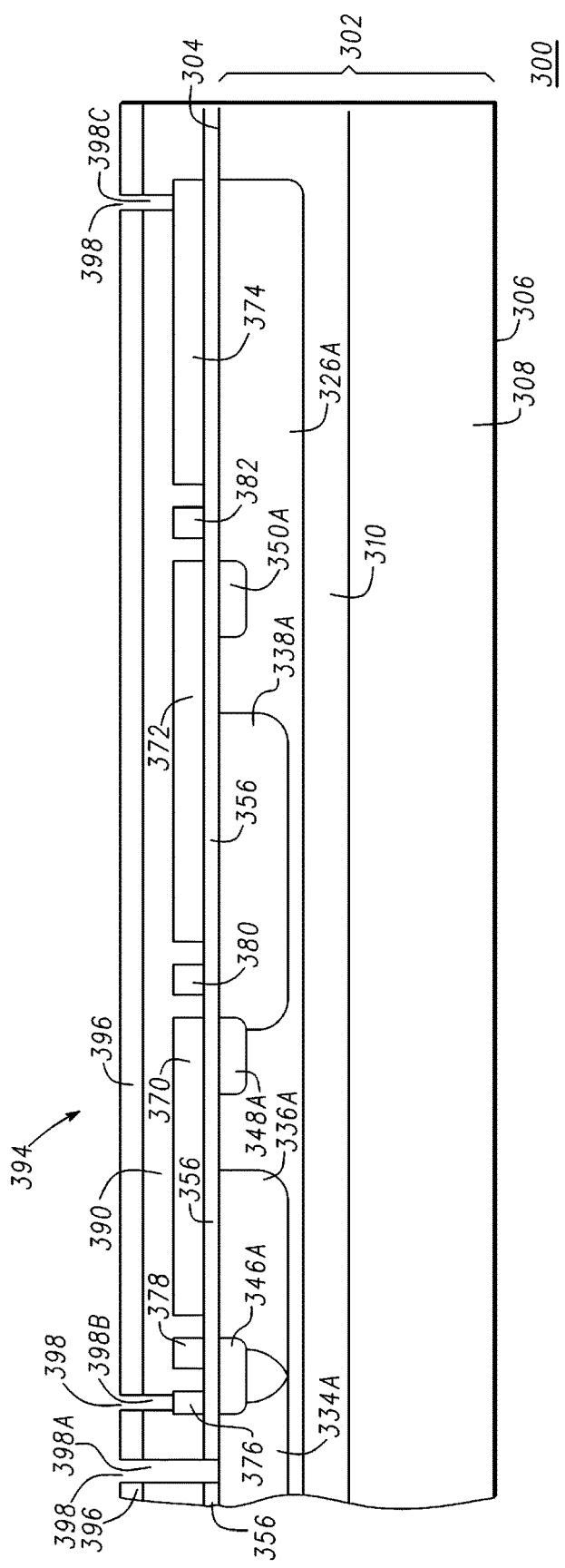
FIG. 14 is a cross-sectional view of the circuit element of FIG. 13 at a later stage of manufacture.

Referring now to FIG. 14, a layer of photoresist is patterned over dielectric layer 390 to form a masking structure 394 having masking elements 396 and openings 398 that expose portions of dielectric layer 390. The portions of dielectric layer 390 unprotected by masking elements 396 are removed using, for example, a reactive ion etch to form openings or 398A, 398B, and 398C extending from corresponding openings 398 that expose portions of electrically conductive structures 376 and 380 and a portion of n-well 334A.

Figure 15:
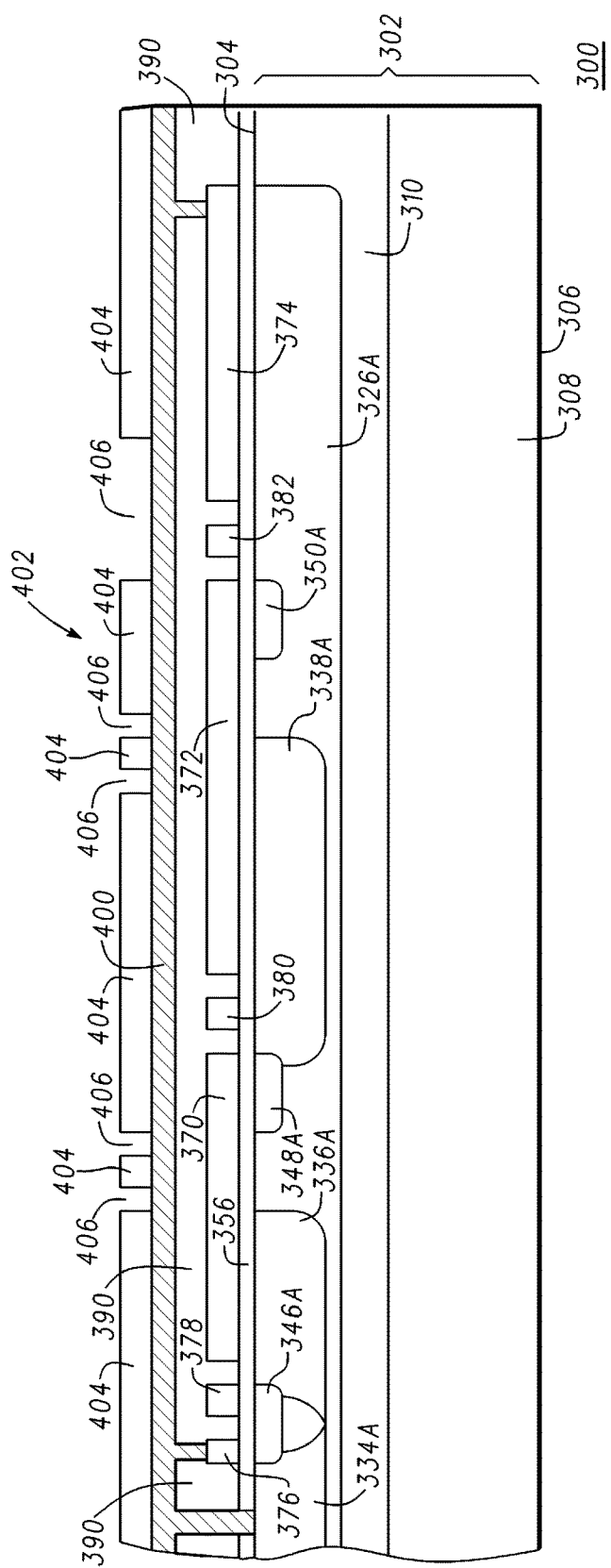
FIG. 15 is a cross-sectional view of the circuit element of FIG. 14 at a later stage of manufacture.

Referring now to FIG. 15, a layer 400 of electrically conductive material is formed on dielectric layer 390 and on the portions of n-well 334A exposed by opening 398A, electrically conductive structure 376 exposed by opening 398A, and electrically conductive structure 380 exposed by opening 398C. Suitable materials for electrically conductive layer 400 include copper, aluminum, a refractory metal, or the like. Although electrically conductive layer 400 is illustrated as a single layer, in accordance with an embodiment, electrically conductive layer 400 is a metallization system comprising a barrier layer, an adhesion layer, and copper. A layer of photoresist is patterned over electrically conductive layer 400 to form a masking structure 402 having a masking elements 404 and openings 406 that expose portions of electrically conductive layer 400.

Figure 16:
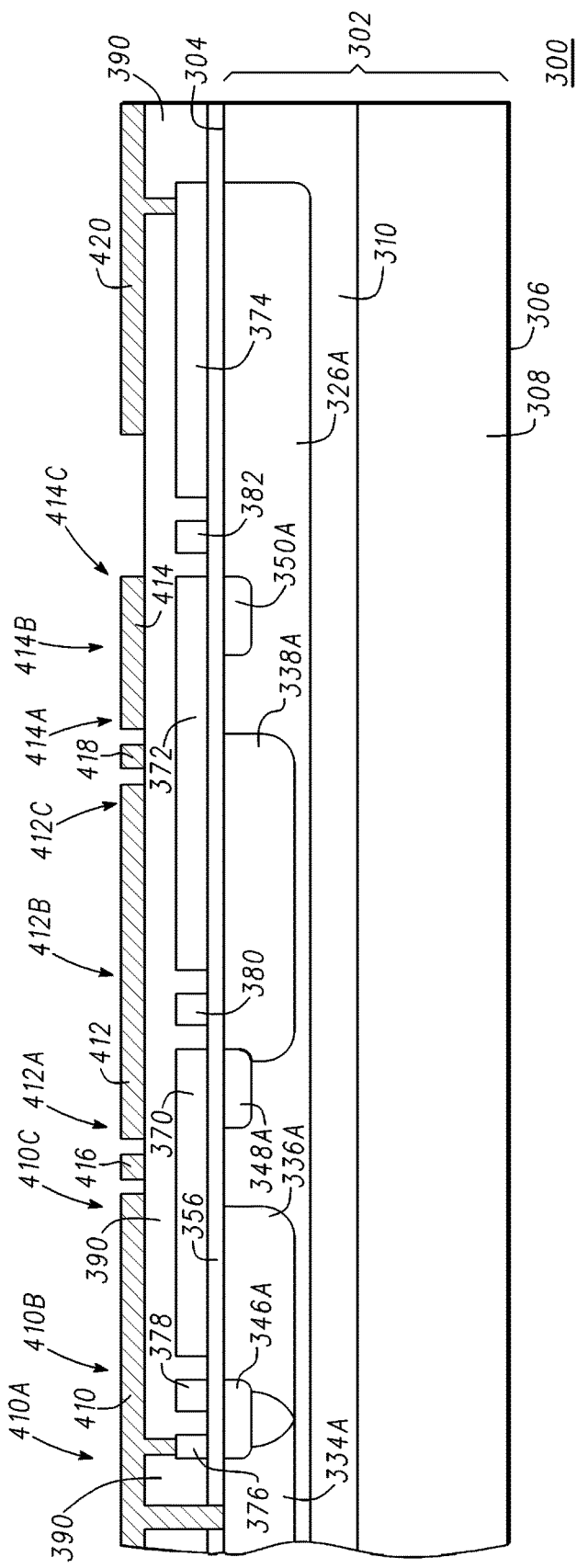
FIG. 16 is a cross-sectional view of the circuit element of FIG. 15 at a later stage of manufacture.

Referring now to FIG. 16, the portions of electrically conductive layer 400 unprotected by masking elements 404 are removed using, for example, a reactive ion etching technique to separate electrically conductive layer 400 into a plurality of portions that serve as electrically conductive structures. More particularly, electrically conductive layer 400 is separated into electrically conductive structures 410, 412, 414, 416, 418, and 420. Electrically conductive structure 410 has an end 410A spaced apart from an end 410C by a central portion 410B. A portion of end 410A electrically contacts n-well 334A to form a Schottky contact 411 that may form a Schottky diode that inhibits parasitic injection under reverse bias conditions. Alternatively, the portion of end 410A may contact n-well 334A to form an Ohmic contact. In accordance with an embodiment, electrically conductive structure 410 is electrically connected to n-well 334A by the electrically conductive material filling opening 398A, wherein the filled opening serves as a filled via. In addition, a portion of electrically conductive structure 410 is electrically connected to electrically conductive structure 376 by the electrically conductive material filling opening 398B, wherein the filled opening serves as a filled via. End 410C is positioned to be above electrically conductive structure 370.

Electrically conductive structure 412 has an end 412A spaced apart from an end 412C by a central portion 412B. In accordance with an embodiment, end 412A of electrically conductive structure 412 is positioned to be above electrically conductive structure 370, central portion 412B is above electrically conductive structure 380, and end 412C of electrically conductive structure 412 is positioned to be above electrically conductive structure 372.

Electrically conductive structure 414 has an end 414A spaced apart from an end 414C by a central portion 414B. In accordance with an embodiment, electrically conductive structure 414 is positioned to be above electrically conductive structure 372.

Electrically conductive structure 416 is positioned to be above electrically conductive structure 370 and laterally positioned to be between electrically conductive structures 410 and 412. More particularly, electrically conductive structure 416 is between end 410C of electrically conductive structure 410 and end 412A of electrically conductive structure 412.

Electrically conductive structure 418 is positioned to be between end 412C of electrically conductive structure 412 and end 414A of electrically conductive structure 414.

Electrically conductive structure 420 is positioned to be above electrically conductive structure 374. In accordance with an embodiment, electrically conductive structure 420 is electrically connected to electrically conductive structure 374 by the electrically conductive material filling opening 398C, wherein the filled opening serves as a filled via. Masking structure 402 is removed.

Figure 17:
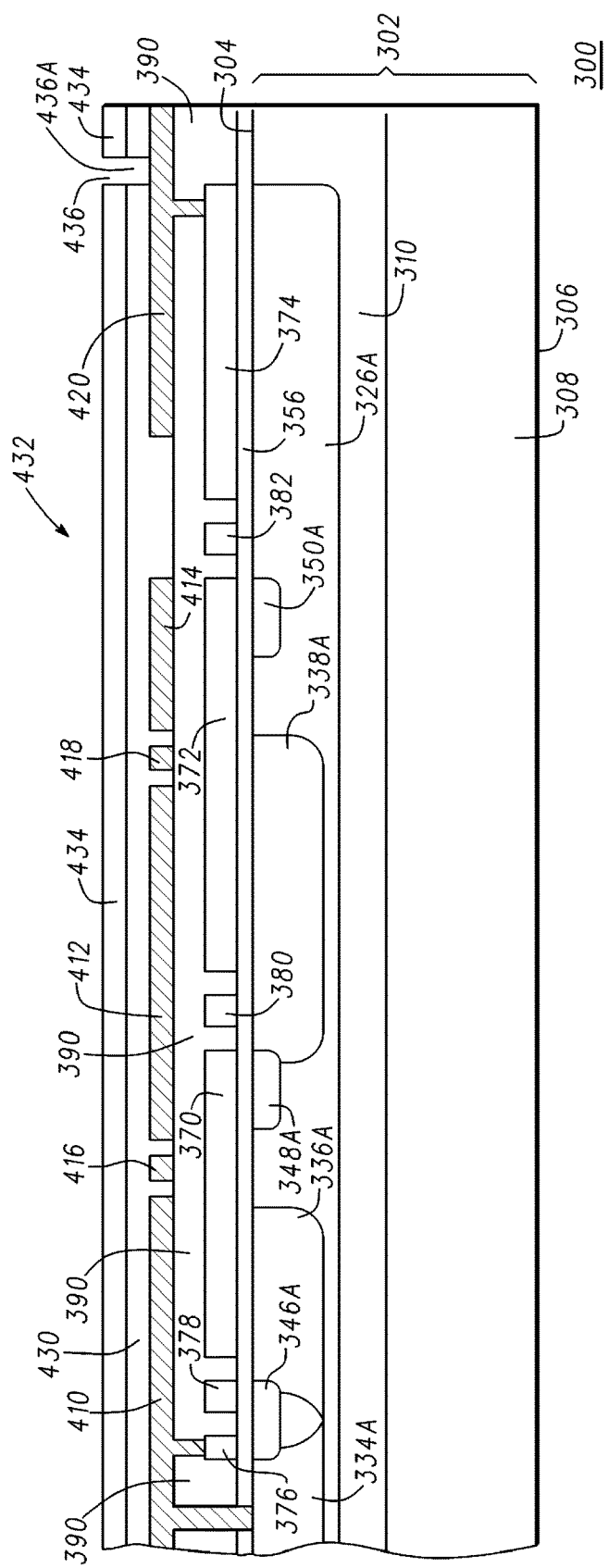
FIG. 17 is a cross-sectional view of the circuit element of FIG. 16 at a later stage of manufacture.

Referring now to FIG. 17, a layer of dielectric material 430 is formed over electrically conductive structures 410, 412, 414, 416, 418, and 420 and over the exposed portions of dielectric layer 390. A layer of photoresist is patterned over dielectric layer 430 to form a masking structure 432 having masking elements 434 and an opening 436 that expose portions of dielectric layer 430. The portions of dielectric layer 430 unprotected by masking elements 434 are removed using, for example, a reactive ion etch to form an opening 436A that exposes a portion of electrically conductive structure 420.

Figure 18:
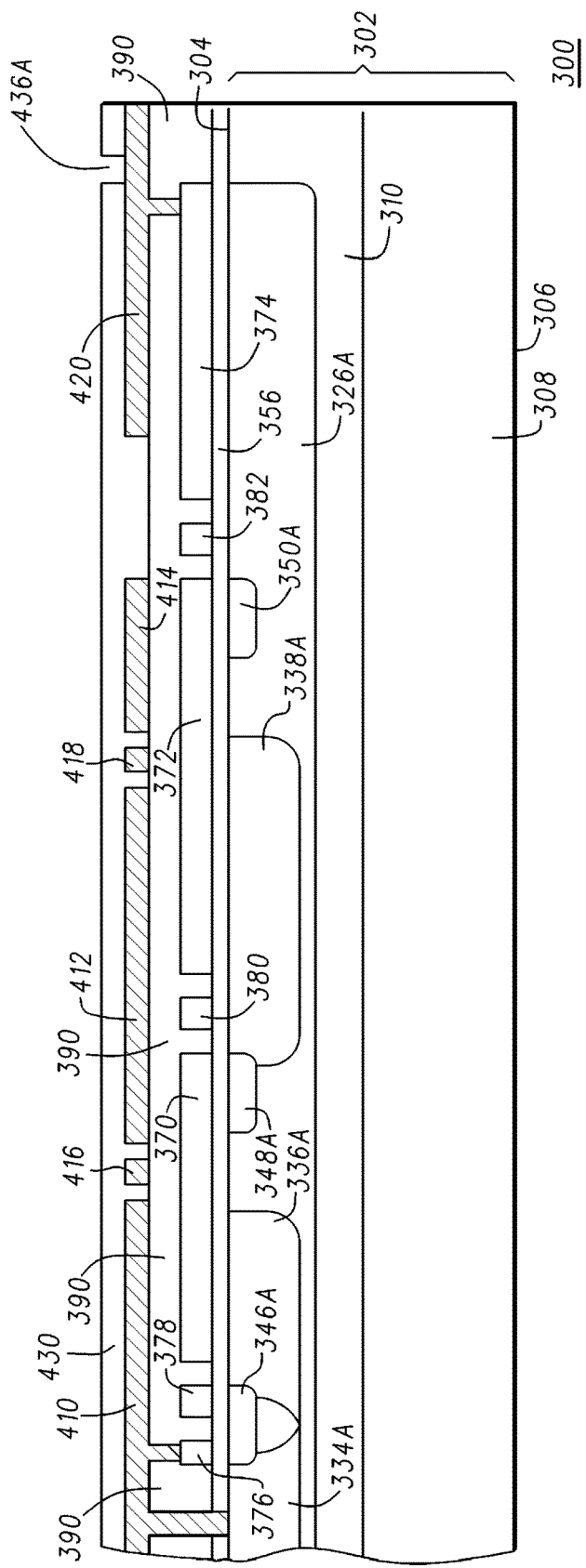
FIG. 18 is a cross-sectional view of the circuit element of FIG. 17 at a later stage of manufacture.

Referring now to FIG. 18, masking structure 402 is removed further illustrating layer of dielectric material 430 and opening 436A.

Figure 19:
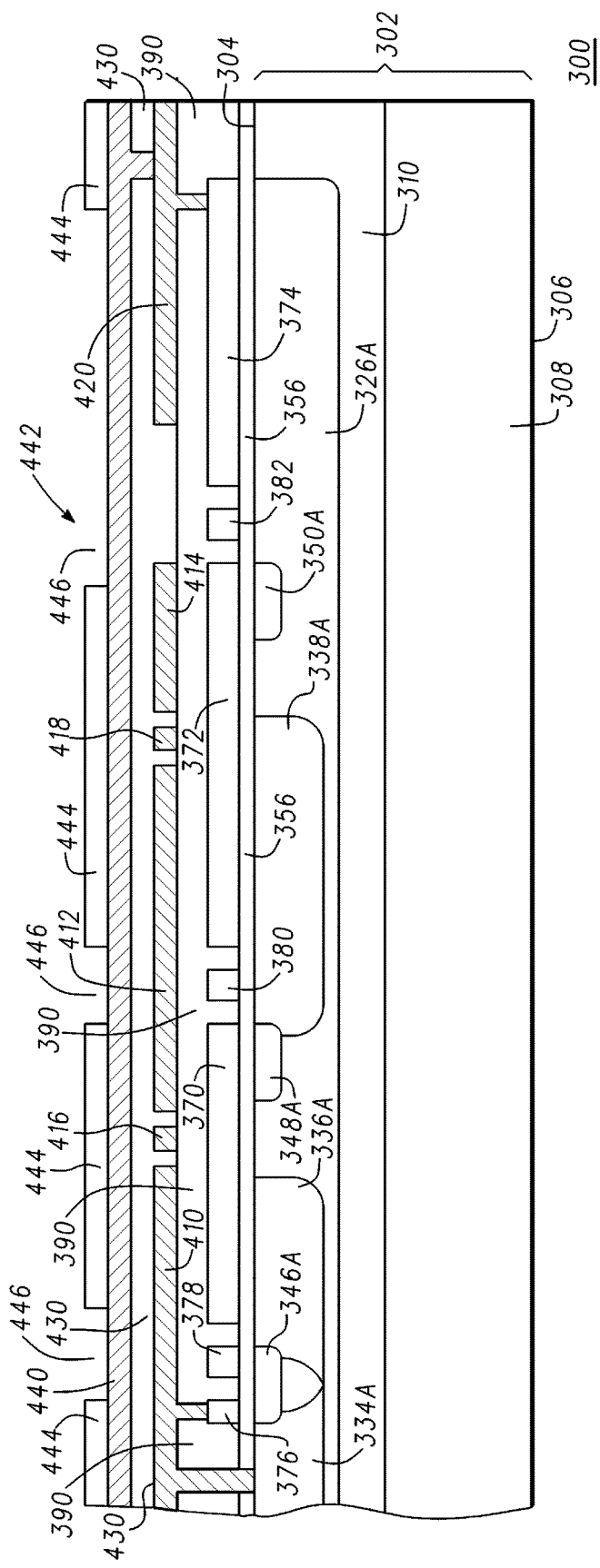
FIG. 19 is a cross-sectional view of the circuit element of FIG. 18 at a later stage of manufacture.

Referring now to FIG. 19, a layer 440 of electrically conductive material is formed on dielectric layer 430 and on the portion of electrically conductive structure 420 exposed by opening 436A. Suitable materials for electrically conductive layer 440 include copper, aluminum, a refractory metal, or the like. Although electrically conductive layer 440 is illustrated as a single layer, in accordance with an embodiment, electrically conductive layer 440 is a metallization system comprising a barrier layer, an adhesion layer, and copper. A layer of photoresist is patterned over electrically conductive layer 440 to form a masking structure 442 having masking elements 444 and openings 446 that expose portions of electrically conductive layer 440.

Figure 20:
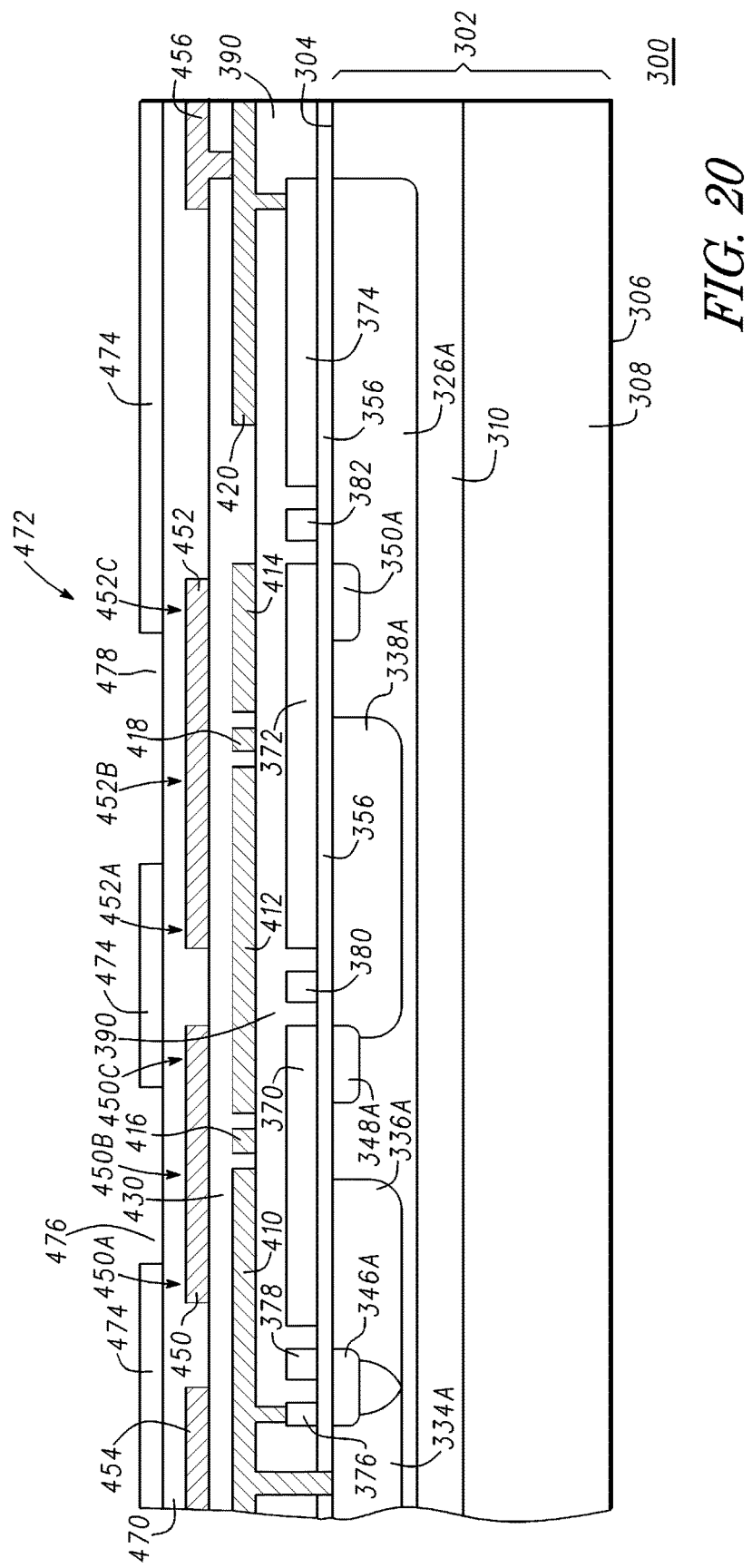
FIG. 20 is a cross-sectional view of the circuit element of FIG. 19 at a later stage of manufacture.

Referring now to FIG. 20, the portions of electrically conductive layer 440 unprotected by masking elements 444 are removed using, for example, a reactive ion etching technique, to separate electrically conductive layer 440 into a plurality of portions that serve as electrically conductive structures. More particularly, electrically conductive layer 440 is separated into electrically conductive structures 450, 452, 454, and 456. Electrically conductive structure 450 has an end 450A spaced apart from an end 450C by a central portion 450B. In accordance with an embodiment, electrically conductive structure 450 is electrically connected to electrically conductive structure 370 by an opening or via (not shown) filled with an electrically conductive material. End 450A of electrically conductive structure 450 is positioned to be above electrically conductive structure 410, central portion 450B of electrically conductive structure 450 is positioned to be above electrically conductive structure 416, and end 450C of electrically conductive structure 450 is positioned to be above electrically conductive structure 412.

Electrically conductive structure 452 has an end 452A spaced apart from an end 452C by a central portion 452B. In accordance with an embodiment, electrically conductive structure 452 is electrically connected to electrically conductive structure 372 by an opening or via (not shown) filled with an electrically conductive material. End 452A of electrically conductive structure 452 is positioned to be above electrically conductive structure 412, central portion 452B of electrically conductive structure 452 is positioned to be above electrically conductive structure 418, and end 452C of electrically conductive structure 452 is positioned to be above electrically conductive structure 414. End 452A of electrically conductive structure 452 is laterally spaced apart from end 450C of electrically conductive structure 450.

Electrically conductive structure 454 is above electrically conductive structure 410 and laterally spaced apart from end 450A of electrically conductive structure 450.

Electrically conductive structure 456 is positioned to be above electrically conductive structure 420. In accordance with an embodiment, electrically conductive structure 456 is electrically connected to electrically conductive structure 420 by the electrically conductive material filling opening 436A, wherein the filled opening serves as a filled via. Masking structure 402 is removed.

Still referring to FIG. 20, a layer of dielectric material 470 is formed over electrically conductive structures 450, 452, 454, and 456, and over the exposed portions of dielectric layer 430. A layer of photoresist is patterned over dielectric layer 470 to form a masking structure 472 having masking elements 474 and an opening 476 that exposes a portion of dielectric layer 470 over electrically conductive structure 450 and an opening 478 that exposes a portion of dielectric layer 470 over electrically conductive structure 452.

Referring now to FIG. 21, the portions of dielectric layer 470 unprotected by masking elements 474, i.e., the portions of dielectric layer 470 exposed by openings 476 and 478, are removed using, for example, a reactive ion etch to expose portions of electrically conductive structures 450, 452, 454, and 456. Portion 470A of dielectric layer 470 remains over portions of electrically conductive structures 450 and 454, portion 470B of dielectric layer 470 remains over portions of electrically conductive structures 450 and 452, and portion 470C of dielectric layer 470 remains over portions of electrically conductive structures 452 and 456. It should be noted that removing the portions of dielectric 470 over the metal capacitor plates is optional and can assist with the equalization of the electric field across the capacitors through surface conduction and conduction through semi-insulating layers in the passivation layer or passivation film.

FIG. 22 is a cross-sectional view of a portion of a semiconductor component 500 such as, for example, a high voltage capacitor, during manufacture in accordance with another embodiment of the present invention. What is shown in FIG. 22 is a semiconductor material 502 having opposing surfaces 504 and 506. Surface 504 is also referred to as a front or top surface and surface 506 is also referred to as a bottom or back surface. In accordance with this embodiment, semiconductor material 502 is comprised of a semiconductor substrate 508 doped with an impurity material of p-type conductivity and having a resistivity ranging from about 70 Ohm-centimeter ($\Omega$-cm) to about 100 $\Omega$-cm. Preferably, the resistivity of substrate 502 is 85 $\Omega$-cm. Suitable materials for substrate 502 include silicon and compound semiconductor materials such as, for example, gallium nitride, gallium arsenide, indium phosphide, Group III-V semiconductor materials, Group II-VI semiconductor materials, or the like.

Alternatively, semiconductor material 500 may be comprised of a semiconductor substrate having an epitaxial layer formed thereon as described with reference to FIG. 8.

A layer of dielectric material 512 is formed on or from semiconductor material 502. In accordance with an embodiment, the material of dielectric layer 512 is silicon dioxide having a thickness ranging from about 100 Angstroms (Å) to about 1,000 Å. Techniques for forming silicon dioxide layer 312 are known to those skilled in the art. For example, dielectric layer 312 may be formed by oxidizing semiconductor material 502 or it may be a TEOS layer formed using plasma enhanced chemical vapor deposition. Dielectric layer 512 may be referred to as a screen implant layer.

An n-type doped region 520 is formed in the portion of semiconductor material 502. N-type doped region 520 may be referred to as an n-well 20. N-type doped region 520 may be formed using techniques similar to the technique for forming n-type doped region 326A described with reference to FIGS. 9-11.

In addition n-type doped regions 522, 534, and 526 are formed in n-well 520 using techniques similar to those described for forming doped regions 334A, 336A, and 338A, respectively, described with reference to FIGS. 9-11. Similarly, p-type doped regions 528, 530, and 532 may be formed in n-well 520 using techniques similar to those described for forming p-type doped regions 346A, 348A, and 350A, respectively, described with reference to FIGS. 9-11. It should be noted that doped regions 520, 522, 524, 526, 528, 530, and 532 are formed to have an annular or circular shape.

Figure 23:
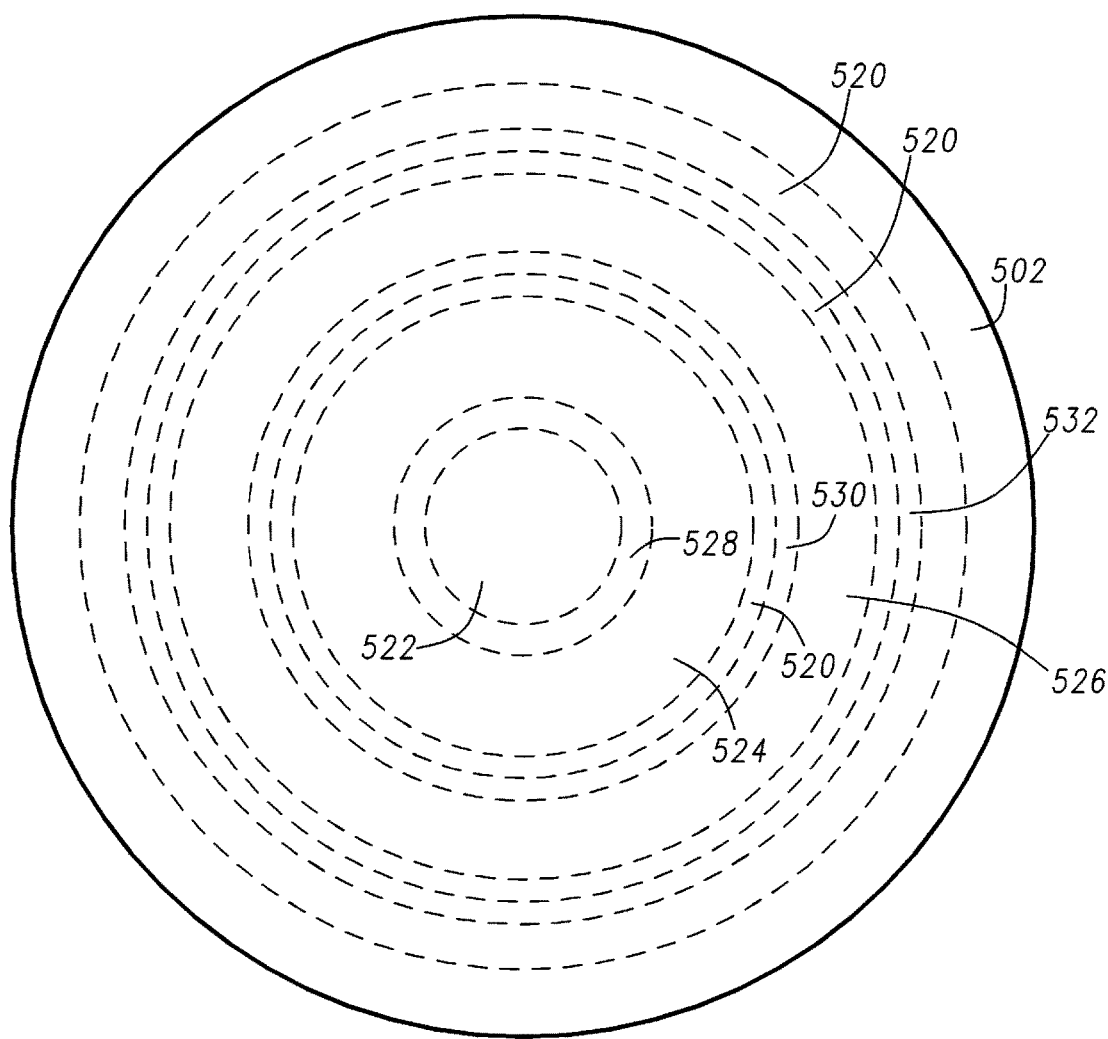
FIG. 23 is a top view of the circuit element of FIG. 22.

FIG. 23 is a top view of semiconductor component 500 further illustrating semiconductor material 502 and the annular shapes of doped regions 520, 522, 524, 526, 528, 530, and 532.

Figure 24:
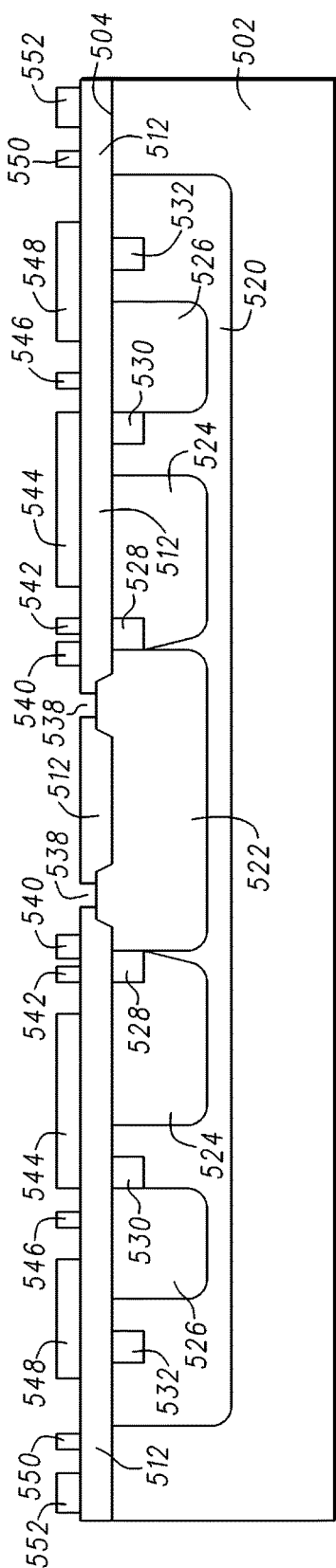
FIG. 24 is a cross-sectional view of the circuit element of FIGS. 22 and 23 at a later stage of manufacture in accordance with another embodiment of the present invention.

Referring now to FIG. 24, electrically conductive structures 540, 542, 544, 546, 548, 550, and 552 are formed over dielectric layer 512. In accordance with an embodiment, electrically conductive structures 540, 542, 544, 546, 548, 550, and 552 are formed from a layer of polysilicon using a technique similar to forming electrically conductive structures 370, 372, 374, 376, 378, 380, and 382 described with reference to FIG. 13. It should be noted that electrically conductive structures 540, 542, 544, 546, 548, 550, and 552 are formed to have an annular or circular shape. FIG. 24 further illustrates an opening 538 in dielectric layer 512 that exposes portions of n-well 522.

Figure 25:
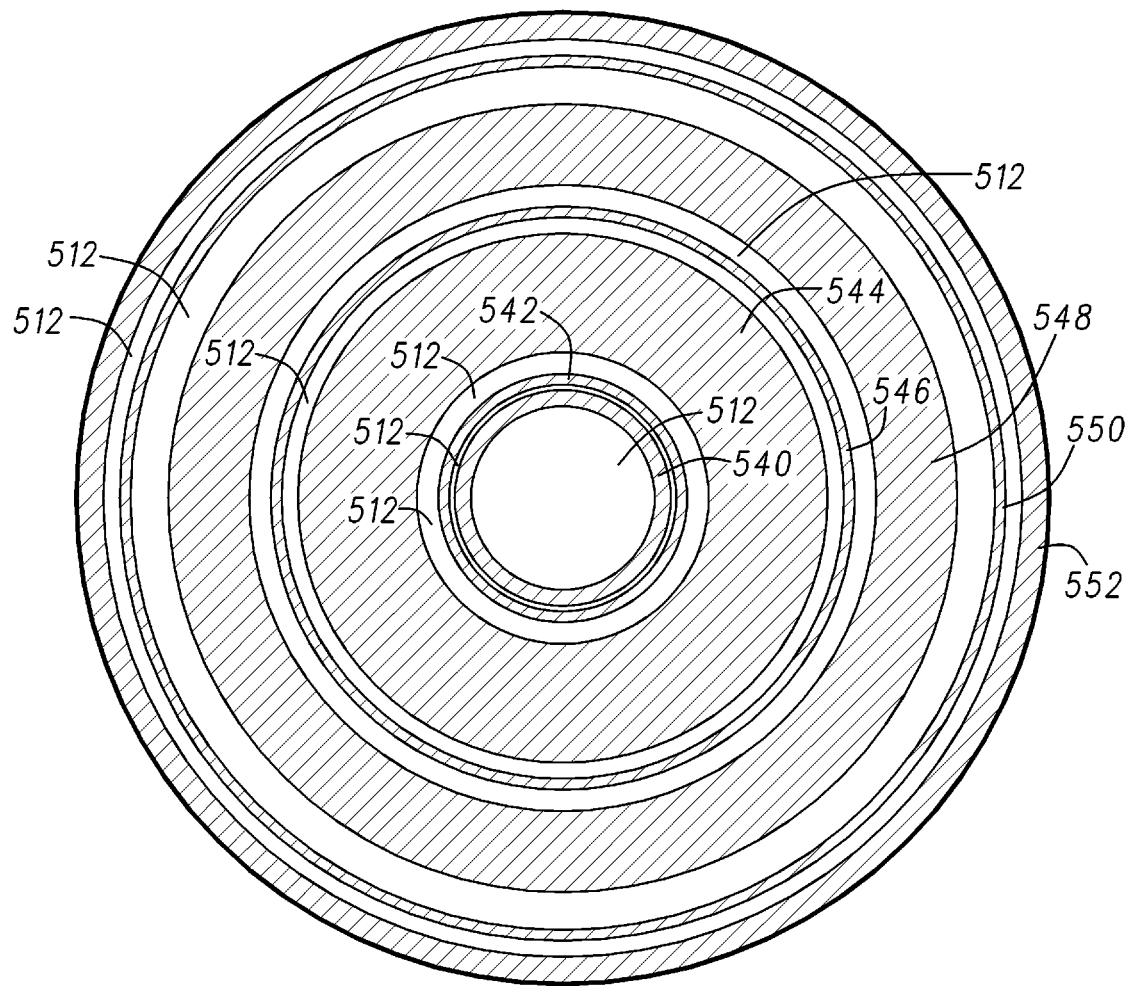
FIG. 25 is a top view of the circuit element of FIG. 24.

FIG. 25 is a top view of semiconductor component 500 further illustrating the annular shapes of electrically conductive structures 540, 542, 544, 546, 548, 550, and 552. FIG. 25 further illustrates an annular opening 538 in dielectric layer 512 that exposes portions of n-well 522.

Figure 26:
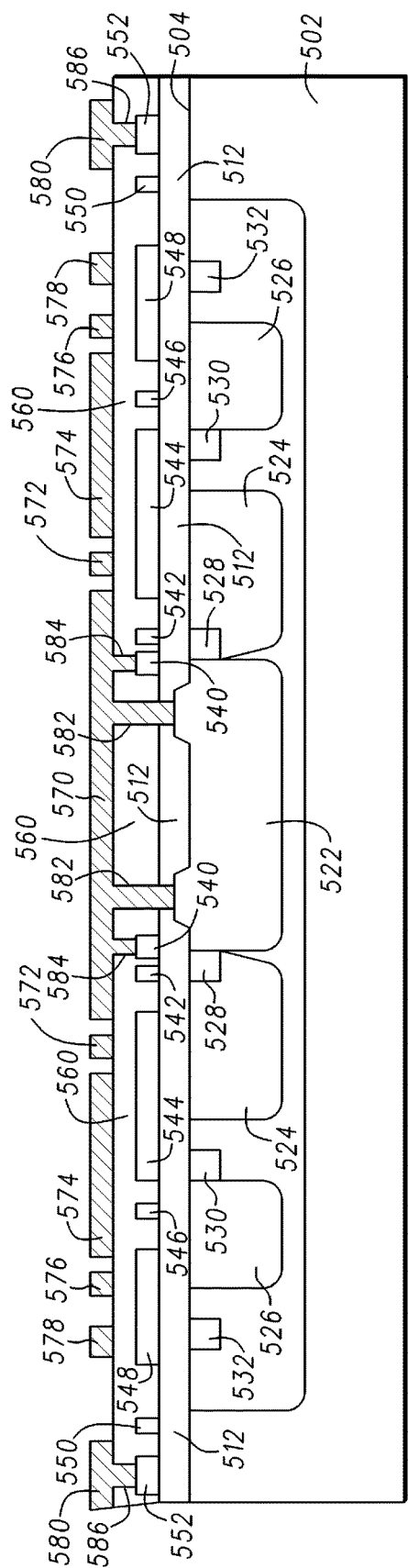
FIG. 26 is a cross-sectional view of the circuit element of FIGS. 24 and 25 at a later stage of manufacture in accordance with another embodiment of the present invention.

Referring now to FIG. 26, a layer of dielectric material 560 is formed over dielectric layer 512 and electrically conductive structures 540, 542, 544, 546, 548, 550, and 552 and electrically conductive structures 570, 572, 574, and 576 are formed over dielectric layer 560. In accordance with an embodiment, electrically conductive structures 570, 572, 574, 576, 578, and 580 are formed from a layer of electrically conductive material using a technique similar to forming electrically conductive structures electrically conductive structures 410, 412, 414, 416, 418, and 420 described with reference to FIG. 16. It should be noted that electrically conductive structures 570, 572, 574, 576, 578, and 580 are formed to have annular or circular shapes. FIG. 24 further illustrates an opening 538 in dielectric layer 512 that exposes portions of n-well 522. It should be noted that electrically conductive structure 570 is connected to doped region 522 through a filled annular shaped via 582 and to electrically conductive structure 540 through a filled annular shaped via 584. Electrically conductive structure 580 is electrically connected to electrically conductive structure 552 through an annular shaped filled via 586.

Figure 27:
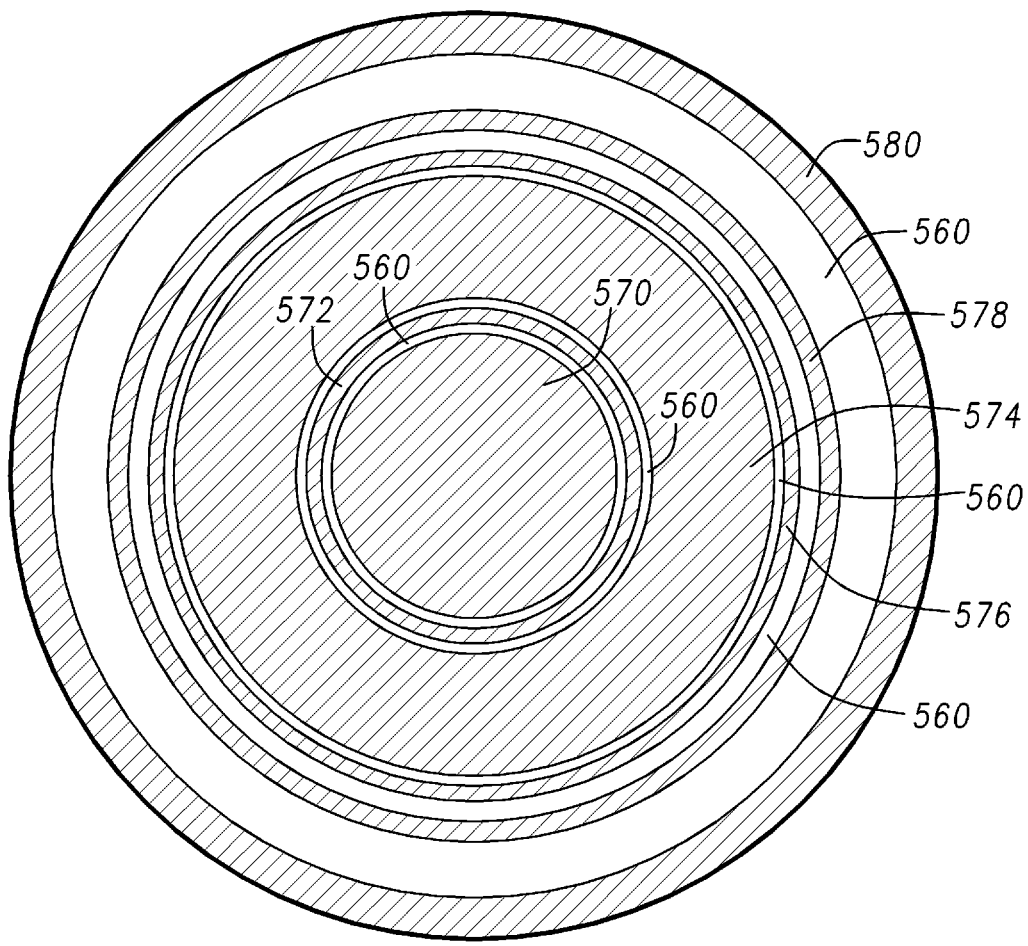
FIG. 27 is a top view of the circuit element of FIG. 26.

FIG. 27 is a top view of semiconductor component 500 further illustrating the annular shapes of electrically conductive structures 570, 572, 574, 576, 578, and 580. FIG. 25 further illustrates an annular opening 538 in dielectric layer 512 that exposes portions of n-well 522.

Figure 28:
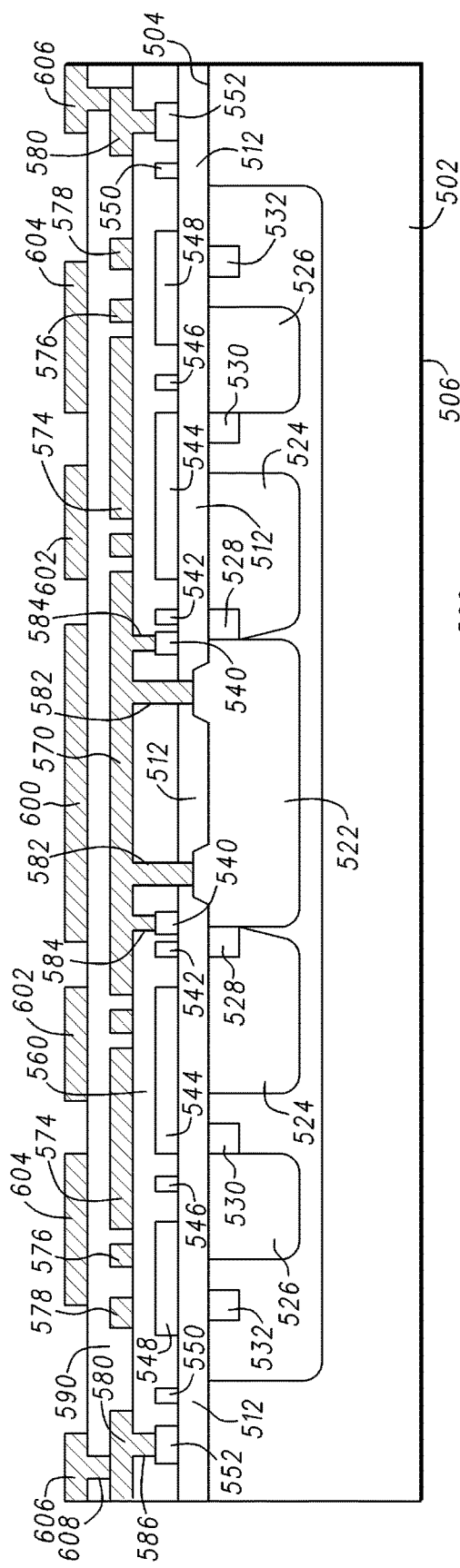
FIG. 28 is a cross-sectional view of the circuit element of FIGS. 26 and 27 at a later stage of manufacture in accordance with another embodiment of the present invention.

Referring now to FIG. 28, a layer of dielectric material 590 is formed over dielectric layer 560 and electrically conductive structures 570, 572, 574, 576, 578, and 580 and electrically conductive structures 600, 602, 604, and 606 are formed over dielectric layer 590. In accordance with an embodiment, electrically conductive structures 600, 602, 604, and 606 are formed from a layer of electrically conductive material using a technique similar to the technique for forming electrically conductive structures electrically conductive structures 450, 452, 454, and 456 described with reference to FIG. 20. It should be noted that electrically conductive structures 600, 602, 604, and 606 are formed to have annular or circular shapes. It should be noted that electrically conductive structure 590 is connected to electrically conductive structure 580 through a filled annular shaped via 608.

Figure 29:
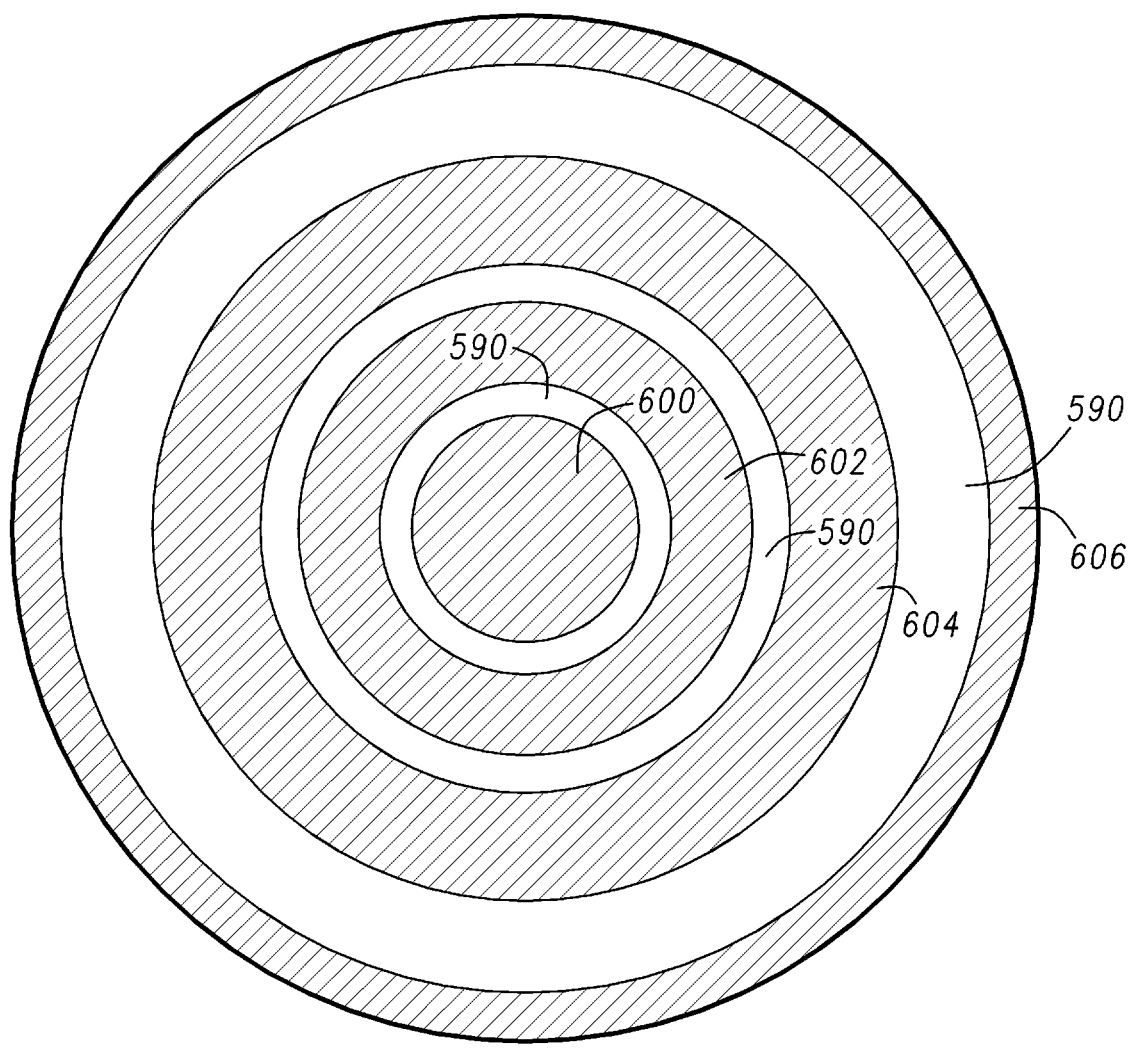
FIG. 29 is a top view of the circuit element of FIG. 28.

FIG. 29 is a top view of semiconductor component 500 further illustrating the annular shapes of electrically conductive structures 600, 602, 604, and 606.

Figure 30:
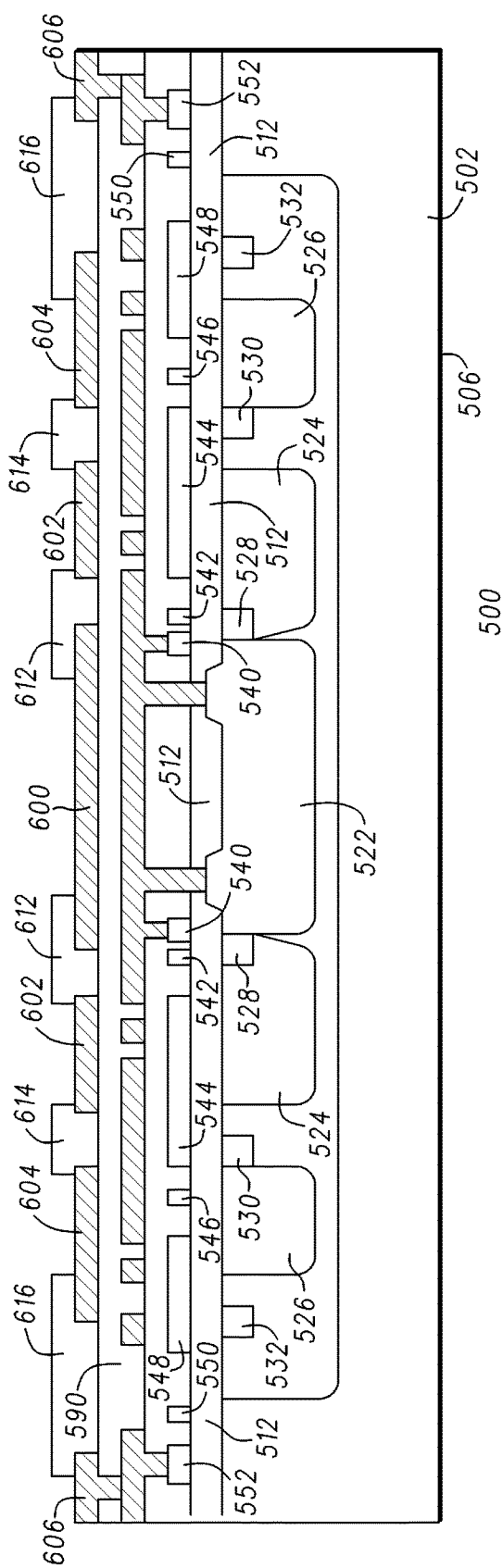
FIG. 30 is a cross-sectional view of the circuit element of FIGS. 28 and 29 at a later stage of manufacture in accordance with another embodiment of the present invention.

FIG. 30 is a cross-sectional view of semiconductor component 500 further along in manufacture and illustrates passivation structures 612, 614, and 616. It should be appreciated that semiconductor component 500 is capable of achieving a breakdown voltage of at least 700 volts, wherein the high voltage capacitor is comprised of four 200 volt capacitors in series. In accordance with an embodiment, each capacitor structure is formed as a parallel combination of a metal 2 layer-metal 1 layer capacitor and a metal 1 layer-polysilicon layer capacitor, wherein the metal 2 layer is connected to the polysilicon layer through vias filled with an electrically conductive material. More particularly, the metal 2 layer may be electrically conductive layer 440 from which electrically conductive structures 450, 452, 454, and 456 are manufactured; the metal 1 layer may be electrically conductive layer 400 from which electrically conductive structures 410, 412, 414, 416, 418, and 420 are formed; and the polysilicon layer may be electrically conductive layer 358 from which electrically conducive structures 370, 372, 374, 376, 378, 380, and 382 are formed. A PN junction may be added to grade lateral potential under the capacitor elements. The n-well 520 is connected to HV potential through the Schottky contact to avoid any parasitic injection when HV input is in reverse bias condition. An ohmic contact may be used in embodiments in which a reverse bias condition is absent. The charge is balanced by forming concentric n-wells 524 and 526 within n-well 520 that are configured as ring or annular shaped structures. N-wells 524 and 526 may be referred to as n-well rings. It should be appreciated that one type of n-well may be used by selecting the doping of the n-well. P-wells 528, 530, and 532 are included and configured as ring or annular shaped structures adjacent the edges of corresponding n-well rings 524 and 526. P-wells 528, 530, and 532 may be referred to as p-well rings and can be configured to adjust the electric field. In accordance with embodiments, the high voltage potential is substantially equally divided between the capacitor structures which may be accomplished using a semi-insulating material. By way of example, the semi-insulating material may be silicon rich nitride (SiRN) in which passivation cuts may be formed. The passivation cuts connect silicon rich resistors to electrically conductive structures 450, 452, 454, and 456 of each capacitor, thereby creating a high resistive voltage divider network.

Figure 31:
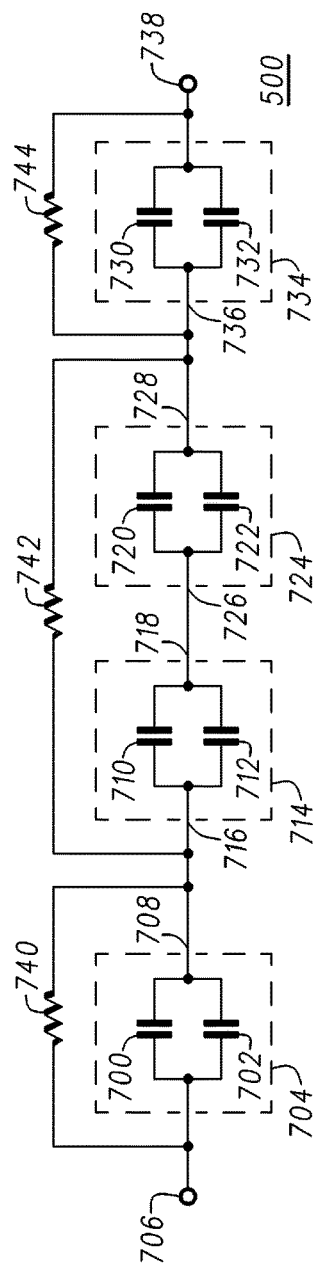
FIG. 31 is a circuit schematic of the circuit element shown in FIG. 30.

FIG. 31 is a circuit representation of high voltage capacitor 500 illustrated in FIGS. 22-30. More particularly, high voltage capacitor 500 is comprised of series connected parallel capacitor structures 704, 714, 724, and 734. More particularly, parallel capacitor structure 704 is comprised of a capacitor 700 connected in parallel with a capacitor 702 and having a terminal 706 and a terminal 708; parallel capacitor structure 714 is comprised of a capacitor 710 connected in parallel with a capacitor 712 and having a terminal 716 and a terminal 718; parallel capacitor structure 724 is comprised of a capacitor 720 connected in parallel with a capacitor 722 and having a terminal 726 and a terminal 728; and parallel capacitor structure 734 is comprised of a capacitor 730 connected in parallel with a capacitor 732 and having a terminal 736 and a terminal 738. Terminal 708 of parallel capacitor structure 704 is connected to terminal 716 of parallel capacitor structure 714, terminal 718 of parallel capacitor structure 714 is connected to terminal 726 of parallel capacitor structure 724, and terminal 728 of parallel capacitor structure 724 is connected to terminal 736 of parallel capacitor structure 734. Terminals 706 and 738 serve as external terminals for high voltage capacitor 500. A silicon rich nitride resistor 740 has a terminal connected to terminal 706 and a terminal connected to terminal 708 of capacitor structure 708; a silicon rich nitride resistor 742 has a terminal connected to terminal 716 of capacitor structure 714 and a terminal connected to terminal 728 of capacitor structure 724; and a silicon rich nitride resistor 744 has a terminal connected to terminal 736 of capacitor structure 734 and a terminal connected to terminal 738.

By now it should be appreciated that an electrical component and a method for manufacturing the electrical component have been provided. In accordance with embodiments, the electrical component is a capacitor structure that may be comprised of a high voltage capacitor that can be provided on an integrated circuit (IC) along with, for example, a switching power controller circuit. By providing the high voltage capacitor inside the package with the controller circuit, concerns about parasitic capacitance external to the IC are much less a concern and thus the capacitance value can be substantially smaller than would be required of an external monolithic capacitor. In examples fabricated, the capacitor can tolerate an 800V range, with on the order of 175 volts divide across each series-connected parallel sets of capacitances. PN junctions under the capacitor structure and electrically isolated strips between portions on the first and second conductor layers direct electric filed lines to avoid high field spots in the semiconductor material under the conductor elements of the capacitor structure.

In accordance with an embodiment, a high voltage capacitor is provided that is suitable for high voltage sensing. The high voltage capacitor may be a monolithically integrated high voltage capacitor structure comprising four capacitors connected in series that includes pn junctions and a voltage balancing semi-insulating layer. In addition, a silicon rich nitride layer may be provided that serves as a passivation structure that can be configured to provide charge balancing through the incorporation of passivation cuts.

In addition, the pn junctions may be reverse biased to provide a graded lateral potential.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A method of manufacturing an electrical component including a high voltage capacitor, comprising:
    providing a semiconductor material of a second conductivity type having a major surface;
    forming a first layer of dielectric material over the major surface;
    forming a first electrically conductive structure over a first portion of the first layer of dielectric material, the first electrically conductive structure having first, second, and third portions, the first portion of the first electrically conductive structure separated from the third portion of the first electrically conductive structure by the second portion of the first electrically conductive structure;
    forming a second electrically conductive structure over a second portion of the first layer of dielectric material;
    forming a third electrically conductive structure over a third portion of the first layer of dielectric material, the third electrically conductive structure having first, second, and third portions, the first portion of the third electrically conductive structure spaced apart from the third portion of the third electrically conductive structure by the second portion of the third electrically conductive structure;
    forming a second layer of dielectric material over the first electrically conductive structure, the second electrically conductive structure, and the third electrically conductive structure;
    forming a fourth electrically conductive structure over a first portion of the second layer of dielectric material, the fourth electrically conductive structure having first, second, and third portions, the first portion of the fourth electrically conductive structure separated from the third portion of the fourth electrically conductive structure by the second portion of the fourth electrically conductive structure, wherein the first portion of the fourth electrically conductive structure is over the first electrically conductive structure, and the third portion of the fourth electrically conductive structure is over the third electrically conductive structure;
    forming a first dopant region of a first conductivity type in the semiconductor material, the first dopant region of the first conductivity type extending from the major surface into a first portion of the semiconductor material, the second electrically conductive structure over a first portion of the first dopant region of the first conductivity type, and the fourth electrically conductive structure over the second electrically conductive structure and over the third portion of the first electrically conductive structure;
    forming a second dopant region of the second conductivity type in the semiconductor material, the second dopant region of the second conductivity type extending from the major surface into a second portion of the semiconductor material, the first electrically conductive structure over the second dopant region of the second conductivity type and the fourth electrically conductive structure over the second dopant region of the second conductivity type;
    forming a third layer of dielectric material over the fourth electrically conductive structure and over the second layer of dielectric material;
    forming a fifth electrically conductive structure over a first portion of the third layer of dielectric material, the fifth electrically conductive structure having first, second, and third portions, the first portion of the fifth electrically conductive structure separated from the third portion of the fifth electrically conductive structure by the second portion of the fifth electrically conductive structure, wherein the third portion of the fifth electrically conductive structure is over the first portion of the fourth electrically conductive structure; and
    forming a sixth electrically conductive structure over a second portion of the third layer of dielectric material, the sixth electrically conductive structure having first, second, and third portions, the first portion of the sixth electrically conductive structure separated from the third portion of the sixth electrically conductive structure by the second portion of the sixth electrically conductive structure, wherein the second portion of the sixth electrically conductive structure is over the third portion of the fourth electrically conductive structure.

2. The method of claim 1, wherein forming the first electrically conductive structure, forming the second electrically conductive structure, and forming the third electrically conductive structure includes
    forming a layer of polysilicon on the first layer of dielectric material; and
    patterning the layer of polysilicon to form the first electrically conductive structure, the second electrically conductive structure, and the third electrically conductive structure.

3. The method of claim 1, further including forming a seventh electrically conductive structure and an eighth electrically conductive structure on the first layer of dielectric material, and wherein forming the fourth electrically conductive structure includes:
    forming a first metal layer over the second layer of dielectric material; and
    patterning the first metal layer to form at least the fourth electrically conductive structure, and wherein patterning the first metal layer to form at least the fourth electrically conductive structure includes patterning the first metal layer to form a ninth electrically conductive structure having a first portion, a central portion, and a second portion, the first portion of the ninth electrically conductive structure electrically coupled to the eighth electrically conductive structure, and the second portion of the ninth electrically conductive structure over the first electrically conductive structure; and wherein patterning the first metal layer to form at least the fourth electrically conductive structure includes
    forming a tenth electrically conductive structure having a first end, a central portion, and a second end, the first end of the tenth electrically conductive structure laterally spaced apart from the second end of the third electrically conductive structure and wherein the tenth electrically conductive structure is over the seventh electrically conductive structure and is in electrical contact with the seventh electrically conductive structure.

4. The method of claim 1, wherein forming the fifth electrically conductive structure and the sixth electrically conductive structure includes:
forming a metal layer over the third layer of dielectric material; and
separating the metal layer into the fifth electrically conductive structure and the sixth electrically conductive structure, the first portion of the fifth electrically conductive structure over a seventh electrically conductive structure and the third portion of the fifth electrically conductive structure over the first electrically conductive structure, and the sixth electrically conductive structure over the third electrically conductive structure.

5. The method of claim 1, wherein forming the first dopant region of the first conductivity type and the second dopant region of the second conductivity type includes diffusing an impurity material of the first conductivity type and an impurity material of the second conductivity type towards each other so that they merge and form a first p-n junction between the first dopant region of the first conductivity type and the second dopant region of the second conductivity type.

6. The method of claim 1 further including forming a third dopant region of the second conductivity type in the semiconductor material, the third dopant region of the second conductivity type extending from the major surface into a third portion of the semiconductor material, wherein the third portion of the third electrically conductive structure is over the third dopant region of the second conductivity type.

7. The method of claim 1, further including:
forming a seventh electrically conductive structure over a third portion of the third layer of dielectric material, wherein the seventh electrically conductive structure is laterally spaced apart from the sixth electrically conductive structure.

8. The method of claim 1, further including forming a seventh electrically conductive structure over the second layer of dielectric material, wherein a portion of the seventh electrically conductive structure extends through the second layer of dielectric material and a portion of the first layer of dielectric material, and contacts the semiconductor material.

9. The method of claim 1, further including forming a third dopant region of the first conductivity type in the semiconductor material, the third dopant region of the first conductivity type extending from the major surface into a third portion of the semiconductor material, wherein the first portion of the first electrically conductive structure is over the third dopant region of the first conductivity type.

10. The method of claim 9, further including forming a fourth dopant region of the second conductivity type extending from the major surface into a fourth portion of the semiconductor material.

11. The method of claim 10, further including forming a fifth dopant region of the first conductivity type extending from the major surface into a fifth portion of the semiconductor material that is adjacent the fourth dopant region of the second conductivity type; and forming the seventh electrically conductive structure so that it is electrically coupled to the fifth dopant region of the first conductivity type and to an eighth electrically conductive structure.

12. The method of claim 10, wherein forming the third dopant region of the first conductivity type and the fourth dopant region of the second conductivity type includes diffusing an impurity material of the first conductivity type and the fifth dopant region of the second conductivity type towards each other so that they merge and form a p-n junction between the third dopant region of the first conductivity type and the fourth dopant region of the second conductivity type.

13. A method for manufacturing an electrical component including a high voltage capacitor, comprising:
providing a semiconductor material of a second conductivity type having a major surface;
forming a first dopant region of a first conductivity type in a first portion of the semiconductor material, the first dopant region extending from the major surface into the first portion of the semiconductor material;
forming a second dopant region of the first conductivity type in a first portion of the first dopant region of the first conductivity type, the second dopant region of the first conductivity type extending from the major surface into the first portion of the first dopant region of the first conductivity type, wherein the second dopant region of the first conductivity type extends from the major surface into the first dopant region of the first conductivity a distance that is less than a distance that the first dopant region of the first conductivity type extends from the major surface into the semiconductor material;
forming a third dopant region of the first conductivity type in a second portion of the first dopant region of the first conductivity type, the third dopant region of the first conductivity type extending from the major surface into the second portion of the first dopant region of the first conductivity type and wherein the second dopant region of the first conductivity type is laterally within the third dopant region of the first conductivity type, and wherein the third dopant region of the first conductivity type extends from the major surface into the first dopant region of the first conductivity a distance that is substantially equal to the distance that the second dopant region of the first conductivity type extends from the major surface into the first dopant region of the first conductivity type;
forming a fourth dopant region of the second conductivity type in the third dopant region of the first conductivity type and abutting the second dopant region of the first conductivity type, wherein the fourth dopant region of the second conductivity type extends from the major surface into the third dopant region of the first conductivity type a distance that is less than the distance that the second dopant region of the first conductivity type extends from the major surface into the first dopant region, and wherein a p-n junction is formed between the fourth dopant region of the second conductivity type and the second dopant region of the first conductivity type and another p-n junction is formed between the fourth dopant region of the second conductivity type and the third dopant region of the first conductivity type;
forming a fifth dopant region of the first conductivity type in a third portion of the first portion of the first dopant region of the first conductivity type, the fifth dopant region of the first conductivity type surrounding the third dopant region of the first conductivity type, wherein the fifth dopant region of the first conductivity type extends from the major surface into the first dopant region of the first conductivity a distance that is substantially equal to the distance that the third dopant region of the first conductivity type extends from the major surface into first dopant region of the first conductivity type;
forming a first layer of dielectric material over the semiconductor material;

forming a first electrically conductive structure over a first portion of the first layer of dielectric material;

forming a second layer of dielectric material over the first electrically conductive structure;

exposing a first portion of the first dopant region of the first conductivity type;

exposing a first portion of the first electrically conductive structure;

forming a first electrical conductor over a first portion of the second layer of dielectric material, the first electrical conductor having a first portion and a second portion, the first portion of the first electrical conductor electrically coupled to the first portion of the first electrically conductive structure and the second portion of the first electrical conductor electrically coupled to the first portion of the first dopant region;

forming a third layer of dielectric material over the first electrical conductor; and forming a second electrical conductor over a first portion of the third layer of dielectric material, the second electrical conductor having a first end, a second end, and a central portion between the first end and the second end, the second electrical conductor over the first electrical conductor.

14. The method of claim 13, wherein exposing the first portion of the first dopant region of the first conductivity type includes forming a first opening as a circular opening that exposes the first portion of the first dopant region of the first conductivity type and a second portion of the first dopant region of the first conductivity type; and wherein forming the first electrical conductor having the first portion and the second portion further includes forming the first electrical conductor having a third portion electrically coupled to a second portion of the first electrically conductive structure and a fourth portion electrically coupled to a second portion of the first dopant region of the first conductivity type.

15. The method of claim 13, further including:
forming a second electrically conductive structure over a second portion of the first layer of dielectric material;
forming a third electrically conductive structure over a third portion of the first layer of dielectric material; and further including
forming a third electrical conductor electrically coupled to the third electrically conductive structure.

16. The method of claim 15, further including:
forming an opening in the third layer of dielectric material to expose the third electrical conductor; and
forming a fourth electrical conductor electrically coupled to the third electrical conductor.

17. The method of claim 16, further including forming a fifth electrical conductor on the third layer of dielectric material, the fifth electrical conductor laterally surrounding the second electrical conductor.

* * * * *